(12) United States Patent
Kobayashi et al.

(10) Patent No.: US 6,531,775 B1
(45) Date of Patent: Mar. 11, 2003

(54) HIGH-FREQUENCY MODULE

(75) Inventors: Kazuhiko Kobayashi, Kawasaki (JP); Yoshiaki Sano, Nakakoma (JP)

(73) Assignees: Fujitsu Limited, Kawasaki (JP); Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/653,194

(22) Filed: Aug. 31, 2000

(30) Foreign Application Priority Data

Oct. 29, 1999 (JP) .......................................... 11-310159

(51) Int. Cl.⁷ .............................................. H01L 23/34

(52) U.S. Cl. ...................... 257/728; 257/731; 257/692; 257/678; 257/680; 257/687

(58) Field of Search ................................. 257/678–782

(56) References Cited

U.S. PATENT DOCUMENTS

| | | | | |
|---|---|---|---|---|
| 5,467,253 A | * | 11/1995 | Heckman et al. | 257/698 |
| 5,578,796 A | * | 11/1996 | Bhatt et al. | |
| 6,023,096 A | * | 2/2000 | Hotta et al. | 257/787 |
| 6,117,706 A | * | 9/2000 | Yoshiyoka et al. | |
| 6,118,357 A | * | 9/2000 | Tomasevic et al. | |

FOREIGN PATENT DOCUMENTS

JP     11-17063     1/1999

* cited by examiner

*Primary Examiner*—Fetsum Abraham
(74) *Attorney, Agent, or Firm*—Armstrong, Westerman & Hattori, LLP

(57) ABSTRACT

A high-frequency module includes a substrate including a thin film resin sheet. A high-frequency circuit wiring line forming a first wiring layer is formed and a high-frequency circuit component is provided on an upper surface of the substrate. A resin sealing package seals the first wiring layer and the high-frequency circuit component.

9 Claims, 18 Drawing Sheets

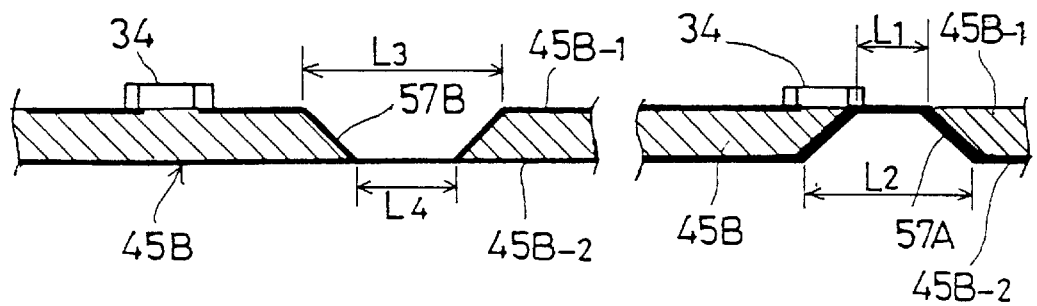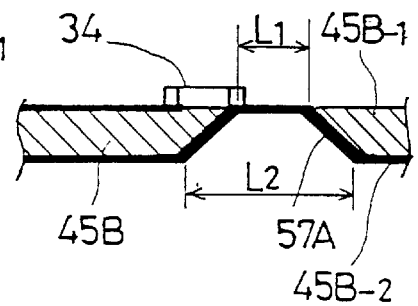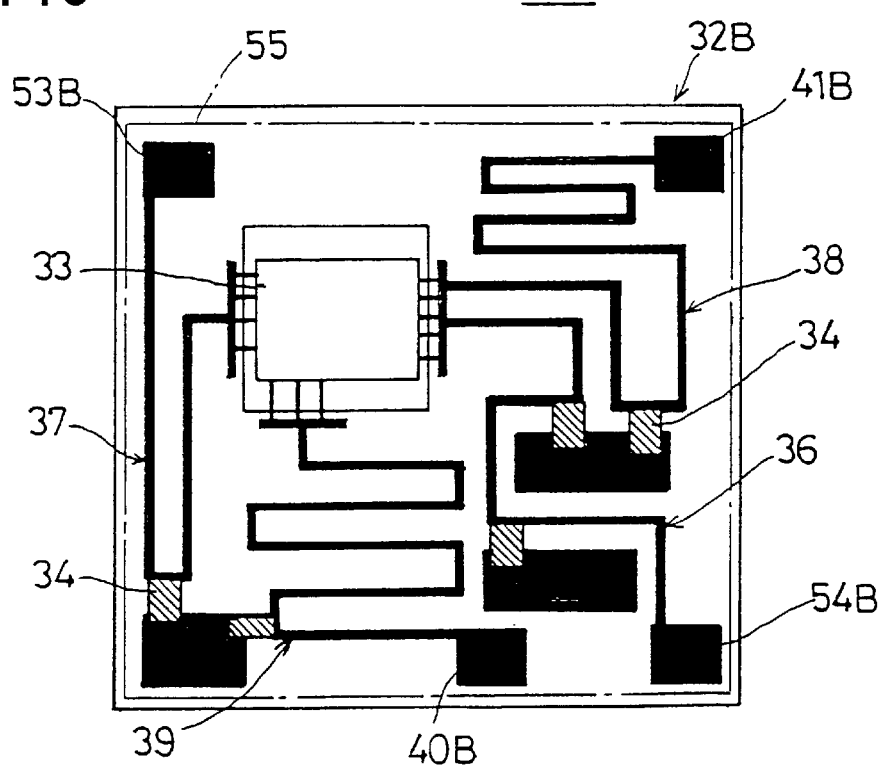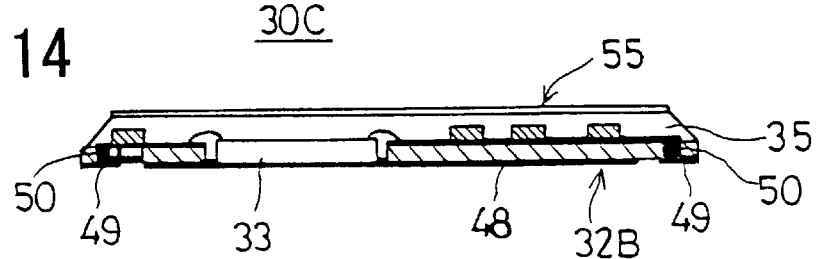

HIGH-FREQUENCY MODULE

BACKGROUND OF THE INVENTION

1. Field of the Invention

The present invention generally relates to high-frequency modules, and more particularly to a high-frequency module suitable for a smaller, thinner, and lighter-weight electronic device.

2. Description of the Related Art

Smaller, thinner, and lighter-weight electronic devices such as portable mobile terminals have been developed at an increasing speed. The portable mobile terminals include high-frequency modules or high-frequency substrates represented by power amplifiers.

Therefore, it is also necessary to develop smaller, thinner, and lighter-weight high-frequency modules in order to obtain smaller, thinner, and lighter-weight portable mobile terminals.

FIGS. 1 and 2 are a schematic plan view and a schematic cross-sectional view of a conventional high-frequency module 1, respectively.

The high-frequency module 1 includes a high-frequency substrate 2, a high-frequency active chip 3 and a plurality of electronic components 4. The high-frequency substrate 2 includes a base material 15 made of ceramics, glass-ceramics, a glass fabric based epoxy resin or the like. The base material 15 has high-frequency circuit wiring lines 6 and 7, direct-current (DC) circuit wiring lines 8 and 9, and pad portions 12 through 14 each formed in a predetermined pattern on its upper surface, and a ground film 18 and land portions 19 formed on its lower surface. Hereinafter, the high-frequency circuit wiring lines 6 and 7 and the DC circuit wiring lines 8 and 9 are referred to as wiring lines 6, 7, 8 and 9, respectively.

An opening portion 16 is formed in a predetermined position in the base material 15 of the high-frequency substrate 2 having the above structure. Mounted in the opening portion 16 is the high-frequency active chip 3, which is electrically bonded to the wiring lines 6 through 9 by bonding wires 17.

The high-frequency substrate 2 has the electronic components 4 mounted thereon, which are joined to the respective wiring lines 6 through 9 by a conductive material such as a solder, a gold paste, or a silver paste. The pad portions 12 through 14 are electrically connected to the ground film 18 formed on the lower surface of the base material 15 by via holes (not shown) formed to penetrate the base material 15.

On the other hand, a high-frequency input terminal 22, a high-frequency output terminal 23, and bias terminals 10 and 11 (hereinafter referred to as terminals 22, 23, 10 and 11, respectively) are formed on the predetermined end portions of the wiring lines 6 through 9, respectively. The terminals 22, 23, 10, and 11 are electrically connected to the respective land portions 19 serving as terminals for external connection by via holes 20 formed to penetrate the base material 15. The land portions 19 are electrically connected to a mounting board when the high-frequency module 1 is mounted thereon. The upper surface of the high-frequency substrate 2 is sealed by a metal cap (not shown) or the like.

For example, Japanese Laid-Open Patent Application No. 11-017063 discloses a package for accommodating a semiconductor chip on which a semiconductor chip compatible with high frequencies, which is different from a high-frequency module, alone is mounted.

Conventionally, however, when ceramics, which is more expensive than a resin material, is employed as the base material 15 of the high-frequency substrate 2 provided for the high-frequency module 1, there arises a problem that the cost of the high-frequency module 1 rises.

Another problem with the conventional high-frequency module 1 is that when ceramics, glass-ceramics, a glass fabric based epoxy resin or the like is employed as the base material 15 of the high-frequency substrate 2, difficulty in reducing the thickness of the base material 15 to 100 $\mu$m or less prevents the thickness of the high-frequency module 1 from being reduced.

Further, when ceramics or glass-ceramics is employed as the base material 15, it is difficult to freely obtain the diameter of each of the via holes 20 in desired size considering the burning shrinkage of a green sheet. When a glass fabric based epoxy resin is employed as the base material 15, it is also difficult to freely form the diameter of each of the via holes 20 in desired size, for there is a limit to the downsizing of the diameter of each of the via holes 20 because through holes to be formed into the via holes 20 are formed by machining.

As an electric circuit, each of the via holes 20 forms an equivalent circuit shown in FIG. 3 including an inductance L, an electrostatic capacity C and a resistance R because the high-frequency module 1 processes a high-frequency signal.

In the high-frequency module 1 processing the high-frequency signal, the equivalent circuit causes the high-frequency characteristic of the high-frequency module 1 to be deteriorated. The impedance of the equivalent circuit increases as the diameter of each of the via holes 20 becomes smaller or the base material 15 becomes thicker.

It is desirable to reduce the impedance of the equivalent circuit as much as possible. According to the conventional high-frequency module 1, however, such difficulties in freely obtaining the desired thickness of the base material 15 and the diameter of each of the via holes 20 in desired size prevent the impedance from being reduced, thus entailing the deterioration of the high-frequency characteristic of the high-frequency module 1 resulting from the via holes 20.

Such measures as to design the circuit of the high-frequency module 1 in consideration of the characteristic of the via holes 20 can be taken in order to preclude the deterioration of the high-frequency characteristics of the high-frequency module 1. However, it is difficult to securely remove the loss resulting from the via holes 20 because the characteristic of the equivalent circuit, as described above, varies depending on the diameter of each of the via holes 20 and the thickness of the base material 15. As the frequency of a signal to be processed in the high-frequency module 1 becomes higher, the high-frequency characteristic thereof becomes more deteriorated, thus causing such a circuit design to be extremely difficult especially in case of a high frequency.

Further, it is desired of the high-frequency module 1 to expand a bandwidth without changing the width of a signal line, which requires the base material 15 to be thinner and a relative dielectric constant to be lower.

However, when a conventional material such as ceramics, glass-ceramics or a glass fabric based epoxy resin is employed as the base material 15, the base material 15 becomes so thick and the dielectric constant becomes so high that it is difficult to expand the bandwidth without changing the width of the signal line. Therefore, when a circuit is designed in a millimeter wave region by employing ceramics, which has a high relative dielectric constant, as a base material, the width of a 50-Ω signal line becomes so narrow as to be difficult to form.

Further, as a measure to radiate heat from a part to be mounted, or the high-frequency active chip 3, thermal vias 21 can be formed in the base material 15 as shown in FIG. 2. When the amount of heat radiated from the high-frequency active chip 3 is so large as to require the thermal resistance of the high-frequency substrate 2 to be reduced, it is possible to increase the number of the thermal vias 21 in order to radiate such amount of heat.

However, it is not desirable to increase the number of the thermal vias 21 in light of the strength of the high-frequency substrate 2. In other words, a problem lies in that the strength of the high-frequency substrate 2 decreases as the heat radiation characteristic is enhanced, while the heat radiation characteristic is deteriorated as the strength thereof increases.

SUMMARY OF THE INVENTION

It is a general object of the present invention to provide a high-frequency module in which the above disadvantages are eliminated.

A more specific object of the present invention is to provide a high-frequency module realizing excellent high-frequency and thermal characteristics and low production cost.

The above objects of the present invention are achieved by a high-frequency module including a substrate including a thin film resin sheet, a high-frequency circuit wiring line forming a first wiring layer, the high-frequency circuit wiring line formed on an upper surface of the substrate, a highfrequency circuit component provided on the upper surface of the substrate, and a resin sealing package formed on the upper surface of the substrate, the resin sealing package sealing the first wiring layer and the high-frequency circuit component.

By employing the thin film resin sheet as the substrate, the high-frequency module can be produced at lower cost compared with a conventional high-frequency module employing a ceramic as a base material for a substrate, and the excellent high-frequency characteristic of the high-frequency module can be realized in the broad bandwidth of a frequency.

The above objects of the present invention are also achieved by the high-frequency module further including the substrate having an opening portion formed in a position where the high-frequency circuit component is to be mounted, and a ground film formed on the lower surface of the substrate closing an opening of the opening portion, wherein the high-frequency circuit component is mounted on the ground film inside the opening portion.

According to the high-frequency module of the above structure, heat generated in the high-frequency circuit component is radiated to outer air through the ground film, thus enhancing the thermal characteristic of the high-frequency module.

BRIEF DESCRIPTION OF THE DRAWINGS

Other objects, features and advantages of the present invention will become more apparent from the following detailed description when read in conjunction with the accompanying drawings, in which:

FIGS. 12A and 12B are diagrams for illustrating a method of forming a via hole in the high-frequency module shown in FIG. 10;

FIG. 13 is a schematic plan view of a high-frequency module according to a third embodiment of the present invention;

FIG. 14 is a schematic cross-sectional view of the high-frequency module shown in FIG. 13;

DETAILED DESCRIPTION OF THE PREFERRED EMBODIMENTS

A description will now be given, with reference to the accompanying drawings, of embodiments of the present invention.

Figure 4:
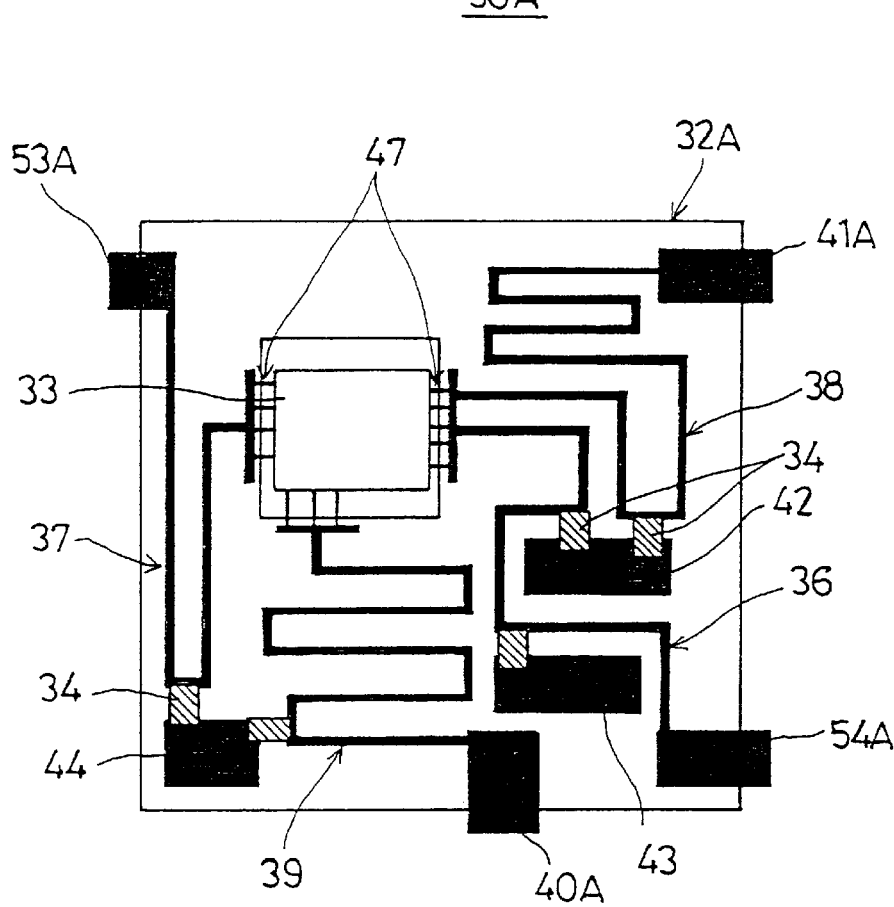
FIG. 4 is a schematic plan view of a high-frequency module according to a first embodiment of the present invention.
Figure 5:
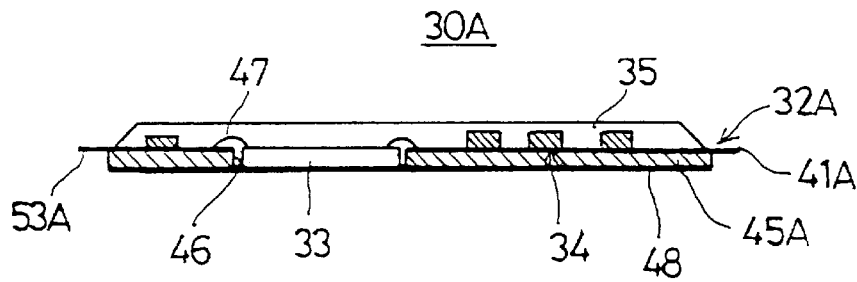
FIG. 5 is a schematic cross-sectional view of the high-frequency module shown in FIG. 4.

FIGS. 4 and 5 are a schematic plan view and a schematic cross-sectional view of a high-frequency module 30A according to a first embodiment of the present invention, respectively. The high-frequency module 30A is employed, for example, as a power amplifier for a portable mobile terminal. Therefore, the high-frequency module 30A is required to be smaller, thinner and lighter-weight.

The high-frequency module 30A according to the present embodiment includes a high-frequency substrate 32A, a high-frequency active chip 33 (or a high-frequency circuit component), a plurality of electronic components 34 and a sealing resin 35 (or a resin sealing package), which is not shown in FIG. 4. The high-frequency substrate 32A, which is the important part of the present invention, employs a thin film resin sheet made of polyimide as a base material 45A.

Thickness of the base material 45A is determined to fall within the range of 25 to 75 $\mu$m, and in the present embodiment, the thickness thereof is set to 50 $\mu$m. Each of base materials 45B through 45E employed in respective embodiments described below is made of polyimide and 50 $\mu$m in thickness.

In the conventional high-frequency module 1 described above by referring to FIGS. 1 and 2, it is difficult to reduce the thickness of the base material 15 to 100 $\mu$m or less because ceramics or the like is employed as the base material 15. However, the thicknesses of the base material 45A can be easily set within the above range of 25 to 75 $\mu$m by employing a polyimide resin as the base material 45A.

The base material 45A has a first wiring layer on its upper surface, wherein high-frequency circuit wiring lines 36 and 37 such as microstrip lines or coplanar lines, direct-current (DC) circuit wiring lines 38 and 39, and pad portions 42 through 44 are formed in a predetermined pattern. The high-frequency circuit wiring lines 36 and 37 are so-called 50-$\Omega$ (signal) lines. Hereinafter, the high-frequency circuit wiring lines 36 and 37 and the DC circuit wiring lines 38 and 39 are also referred to as wiring lines 36, 37, 38 and 39, respectively.

The wiring lines 36 through 39 and the pad portions 42 through 44 are formed, for example, of a copper or gold film as thick as 35 $\mu$m. The wiring lines 36 through 39 form the microstrip lines and $\lambda/4$ lines to form a bias circuit. A grounded ground film 48 is formed on the lower surface of the base material 45A.

A high-frequency active chip 33 is mounted in the base material 45A of the high-frequency substrate 32A having the above structure. In the base material 45A, an opening portion 46 is formed in a position where the high-frequency active chip 33 is mounted. The ground film 48 closes the opening of the bottom portion of the opening portion 46. Therefore, a concave portion is formed by the opening portion 46 and the ground film 48 in the position where the high-frequency active chip 33 is mounted.

The high-frequency active chip 33 is mounted inside the opening portion 46, and is joined by a gold-tin alloy to the ground film 48 positioned at the bottom portion of the opening portion 46. Heat generated in the high-frequency active chip 33 can be efficiently radiated by thus forming the opening portion 46 in and the ground film 48 on the base material 45A so as to mount the high-frequency active chip 33 on the ground film 48 in the opening portion 46.

That is to say, the high-frequency active chip 33 is joined to the ground film 48, of which the outer part is exposed. Because of this structure, the heat generated in the high-frequency active chip 33 is efficiently radiated to outer air through the ground film 48, and thus, the heat radiation characteristic of the high-frequency active chip 33 can be enhanced.

The high-frequency active chip 33 is electrically bonded to the wiring lines 36 through 39 by bonding wires 47 by using a wire bonder. Since the high-frequency active chip 33 is positioned inside the opening portion 46, the bonding position of the high-frequency active chip 33 is substantially leveled with those of the wiring lines 36 through 39. Thereby, the enhancement of the reliability of the wire bonding and the reduction of the loop height of each of the bonding wires 47 can be realized.

The electronic components 34 are mounted on the upper surface of the high-frequency substrate 32A by being soldered to the wiring lines 36 through 39 or to the pad portions 42 through 44. According to the present embodiment, the electronic components 34 are chip capacitors and form an input/output matching circuit together with the high-frequency circuit wiring lines 36 and 37. A hybrid circuit, which is not shown in the present embodiment, such as a branch-line hybrid, a coupler, a rat-race, a reverse-phase hybrid ring or a high-frequency filter can be mounted on the upper surface of the high-frequency substrate 32A.

The pad portions 42 through 44 are electrically connected to the ground film 48 formed on the lower surface of the base material 45A by via holes (not shown) formed to penetrate the base material 45A.

A high-frequency input terminal 53A, a high-frequency output terminal 54A and bias terminals 40A and 41A (hereinafter referred to as terminals 53A, 54A, 40A and 41A, respectively) are formed on the predetermined end portions of the wiring lines 36 through 39, respectively. Each of the terminals 53A, 54A, 40A and 41A is formed to extend outward from the peripheral portion of the upper surface of the base material 45A so as to form a lead (a terminal for external connection).

It is possible to form the high-frequency module 30A to comply with a surface mounting by forming, for example, into a gull-wing shape the extending portion of each of the above terminals 53A, 54A, 40A and 41A, which simply extends outward from the peripheral portion of the upper surface of the base material 45A in FIG. 4.

The sealing resin 35 is formed on the upper surface of the high-frequency substrate 32A so as to form a resin sealing package. The sealing resin 35, which is formed by potting or molding, securely provides a protection for the high-frequency active chip 33, the electronic components 34, the wiring lines 36 through 39, etc. provided on the upper surface of the high-frequency substrate 32A. Because the resin sealing package can be formed irrespective of the shape of the high-frequency substrate 32A, the resin sealing package can easily accommodate a change in the shape of the high-frequency substrate 32A, and the cost thereof is lower than that of a conventionally employed metal cap, which can still be employed to be mounted on the upper surface of the high-frequency substrate 32A instead of the above sealing resin 35.

Figure 1:
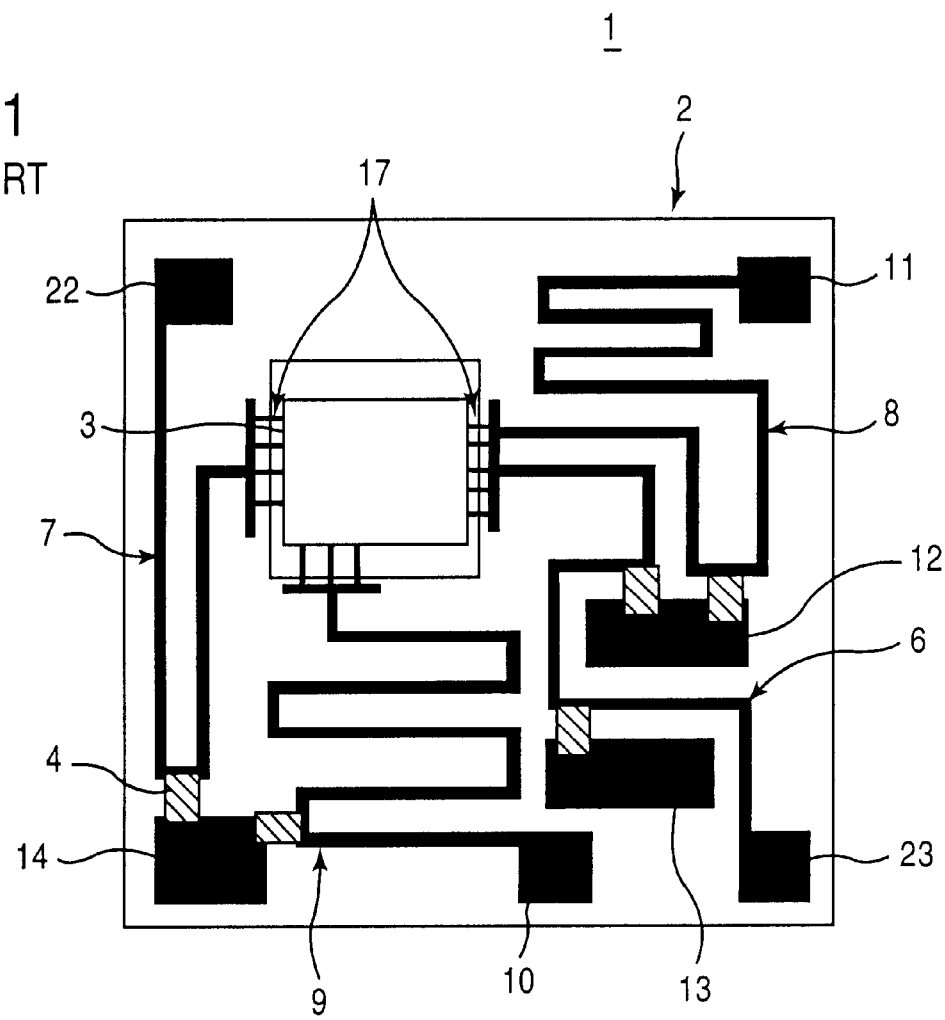
FIG. 1 is a schematic plan view of a conventional high-frequency module.
Figure 2:
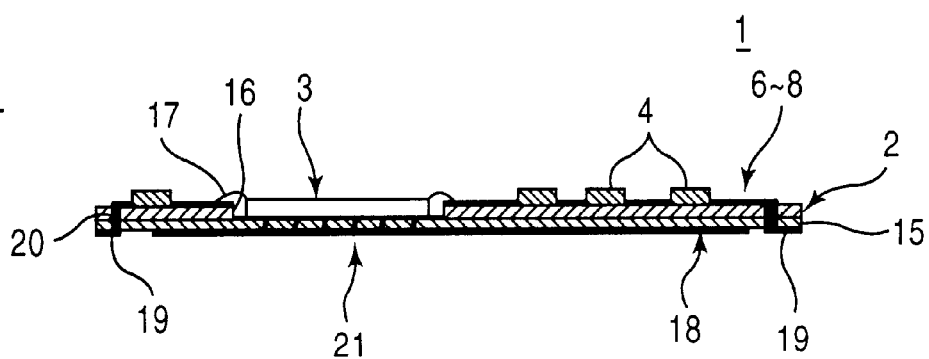
FIG. 2 is a schematic cross-sectional view of the conventional high-frequency module shown in FIG. 1.

The high-frequency module 30A having the above structure employs the thin film resin sheet made of polyimide as the base material 45A of the high-frequency substrate 32A. Because polyimide is less expensive than ceramics, the high-frequency module 30A of the present embodiment including the high-frequency substrate 32A can be formed at lower cost compared with the conventional high-frequency module 1 including the high-frequency substrate 2 employing ceramics as the base material 15 as shown in FIGS. 1 and 2.

As the thin film resin sheet made of polyimide is employed as the base material 45A of the high-frequency substrate 32A, the base material 45A can be thinner than the conventional base material 15 made of ceramics or the like.

Figure 6:
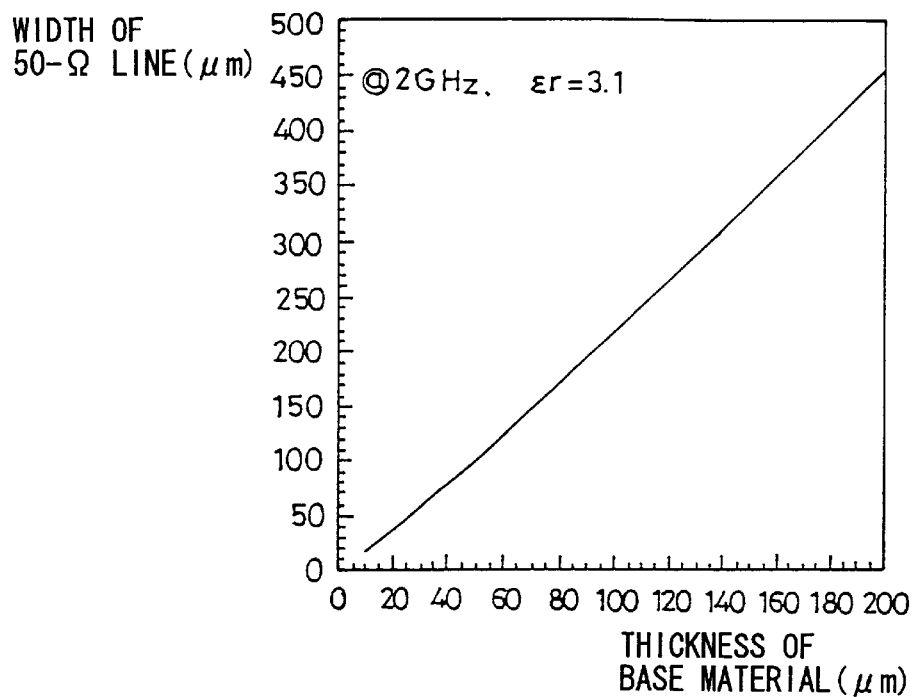
FIG. 6 is a graph illustrating the relation between the width of a 50-Ω line and the thickness of a base material of a substrate.
Figure 7:
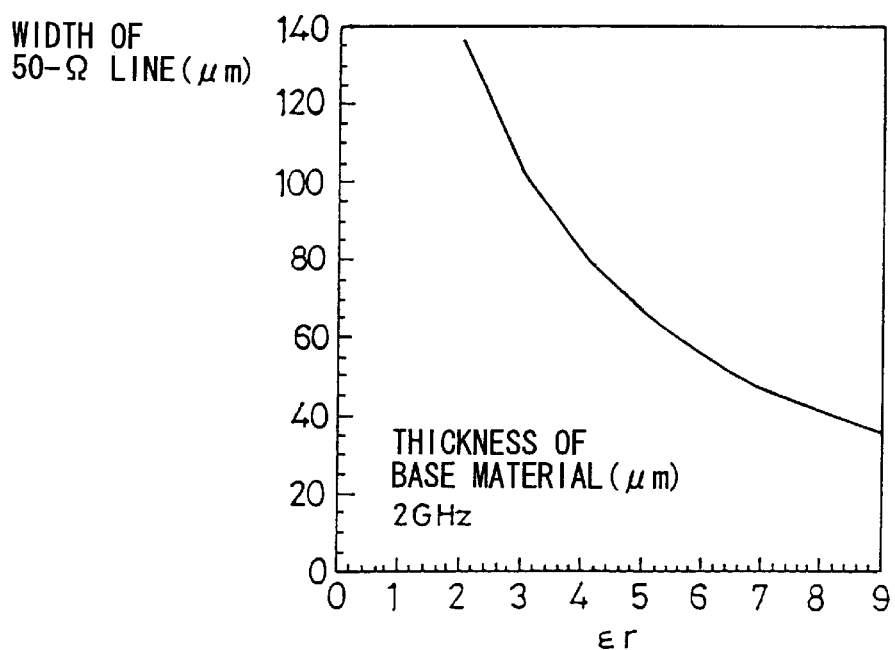
FIG. 7 is a graph illustrating the relation between the width of a 50-Ω line and the relative dielectric constant of a base material of a substrate.

FIG. 6 is a graph illustrating the relation between the width of a 50-Ω line and the thickness of a base material of a substrate when the base material has a relative dielectric constant ∈r of 3.1 and a signal frequency is as high as 2 GHz. FIG. 7 is a graph illustrating the relation between the width of a 50-Ω line and a relative dielectric constant ∈r of a base material when the thickness of the base material is set to 50 μm and a signal frequency is as high as 2 GHz.

It is seen from FIG. 6 that the width of the 50-Ω line can be narrowed by reducing the thickness of the base material even though the relative dielectric constant ∈r thereof is as low as 3.1. The width of the 50-Ω line, for example, is determined to be approximately 200 μm in case of the conventional base material having the thickness of 100 μm. Therefore, the area occupied by the 50-Ω line becomes so large on a high-frequency substrate that the downsizing of a high-frequency module cannot be realized.

On the other hand, when a thin film resin sheet is employed as the base material, the thickness thereof can be reduced to 25 to 75 μm. Therefore, the width of the 50-Ω line can be narrowed to approximately 50 to 150 μm, so that the area occupied by the 50-Ω line on the high-frequency substrate can be reduced. Thus, the downsizing of the high-frequency module can be realized by employing the thin film resin sheet as the base material.

As previously described, the thickness of the base material 45A of the high-frequency substrate 32A according to the present embodiment can be reduced to 25 to 75 μm, so that the width of the 50-Ω line can be narrowed to approximately 50 to 150 μm. Therefore, the area occupied by the 50-Ω line on the high-frequency substrate 32A can be reduced. Thus, the downsizing of the high-frequency module 30A can be realized by employing the thin film resin sheet made of polyimide as the base material 45A.

On the other hand, as a general rule, the width of the 50-Ω line becomes narrower as the relative dielectric constant ∈r becomes higher, as is seen from FIG. 7. However, it is also seen from FIG. 7 that when the thin film resin sheet is employed as the base material so as to reduce the thickness thereof, which is set to 50 μm in the case of FIG. 7, the width of the 50-Ω line can be narrowed despite a low relative dielectric constant ∈r.

For example, when polyimide, which has a relative dielectric constant ∈r of 3.1, is employed as a material for the thin film resin sheet, the width of the 50-Ω line is determined to be approximately 100 μm according to FIG. 7. Thus, the width of the 50-Ω line can be narrowed by reducing the thickness of the base material even when the base material has a low relative dielectric constant ∈r as in the case of the thin film resin sheet.

Therefore, according to the present invention, it is no more required to employ as the base material 45A a conventional material such as ceramics, glass-ceramics or a glass fabric based epoxy resin, which is thick but has a high relative dielectric constant. Therefore, the downsizing of the high-frequency module 30A can be realized.

Figure 8:
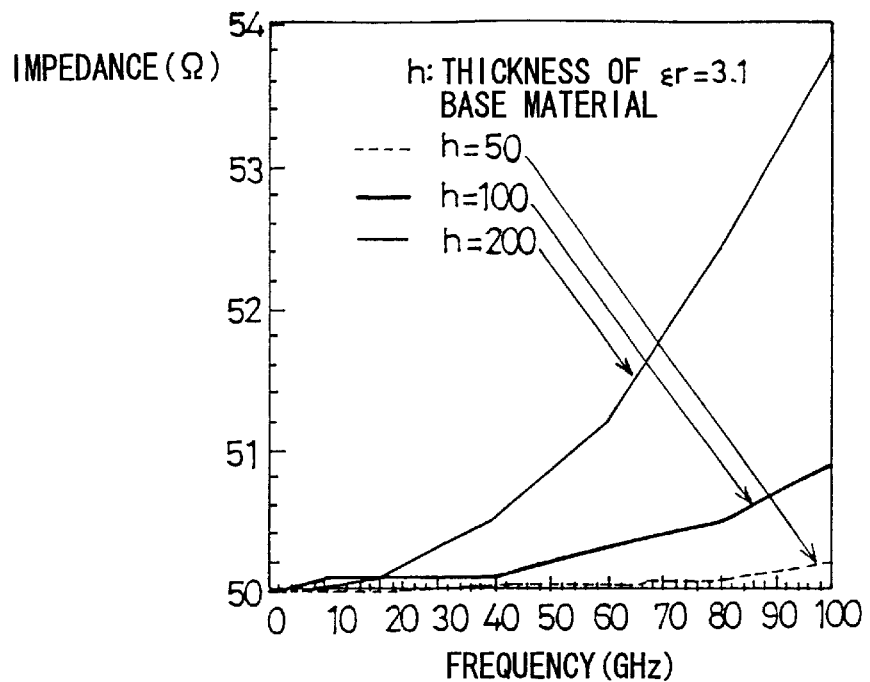
FIG. 8 is a graph illustrating the relation between the impedance of a 50-Ω line and a frequency in use in case of a relative dielectric constant of 3.1.
Figure 9:
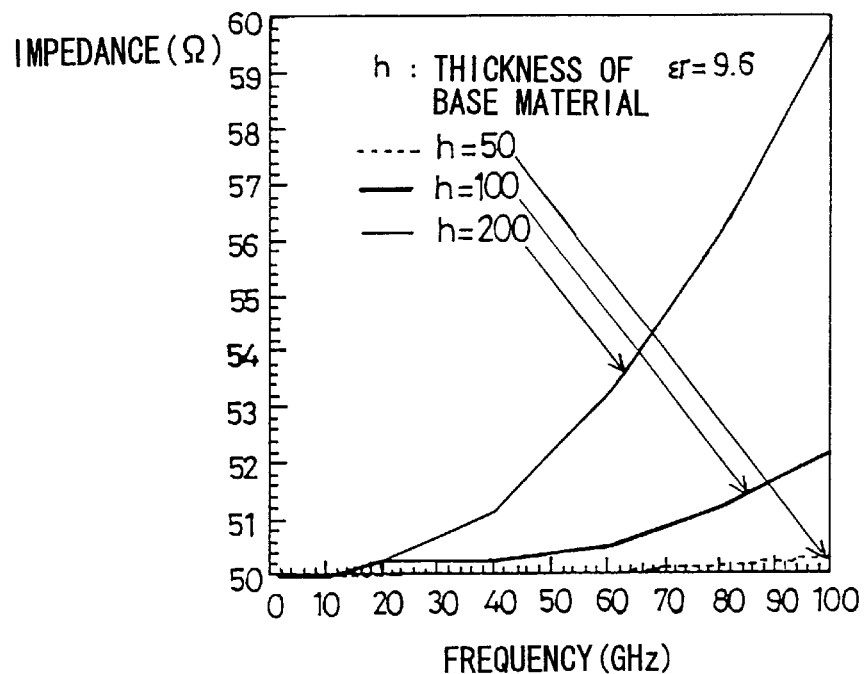
FIG. 9 is a graph illustrating the relation between the impedance of a 50-Ω line and a frequency in use in case of a relative dielectric constant of 9.6.

Further, as a general rule, the impedance of each of the wiring lines 36 and 37 characteristically increases as a frequency in use becomes higher. FIG. 8 is a graph illustrating the relation between the impedance of a 50-Ω line and a frequency in use with respect to each of three base materials having different thicknesses of 50 μm, 100 μm and 200 μm, respectively when each of the three base materials is a thin film resin sheet made of polyimide having the relative dielectric constant ∈r of 3.1. FIG. 9 is a graph illustrating the relation between the impedance of a 50-Ω line and a frequency in use with respect to each of three base materials having different thicknesses of 50 μm, 100 μm and 200 μm, respectively when each of the three base materials is made of ceramics having a relative dielectric constant ∈r of 9.6. In each of FIGS. 8 and 9, the width of the 50-Ω line is so fixed as to set the impedance thereof to 50-Ω when the frequency is 2 GHz.

As shown in FIGS. 8 and 9, the rate of increase in the impedance lowers as each of the base materials becomes thinner. Further, a comparison between FIGS. 8 and 9 demonstrates that the rate of increase in the impedance is lower with a material of a low relative dielectric constant ∈r such as polyimide shown in FIG. 8 than with a material of a high relative dielectric constant ∈r such as ceramics or the like shown in FIG. 9.

Therefore, by employing polyimide having a low relative dielectric constant Er as the base material 45A and by reducing the thickness thereof, the impedance of each of the wiring lines 36 through 39 can be maintained to a low value in the broad bandwidth of a frequency, so that a high-frequency circuit having an excellent high-frequency characteristic can be realized in the broad bandwidth of a frequency.

As previously described, the high-frequency substrate 32A of an excellent high-frequency characteristic in the broad bandwidth of the frequency, a low thermal resistance and a low cost can be realized by employing the thin film resin sheet made of polyimide as the base material 45A. Therefore, a thinner portable mobile terminal can be realized at low cost by incorporating therein the high-frequency module 30A of the present embodiment.

In addition, the high-frequency module 30A, which flexibly deforms in accordance with the shape of a portable mobile terminal when mounted thereon, can be formed at low cost by taking advantage of the flexibility of the base material 45A.

A description will now be given of a second embodiment of the present invention.

Figure 10:
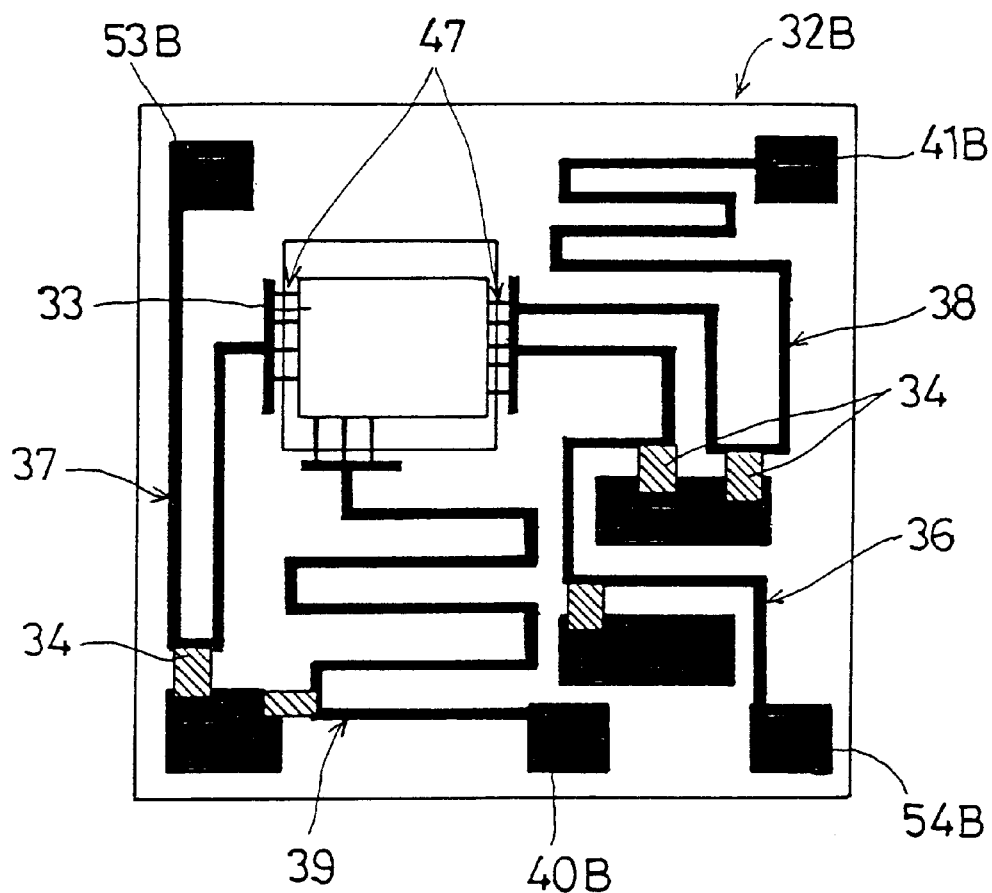
FIG. 10 is a schematic plan view of a high-frequency module according to a second embodiment of the present invention.
Figure 11:
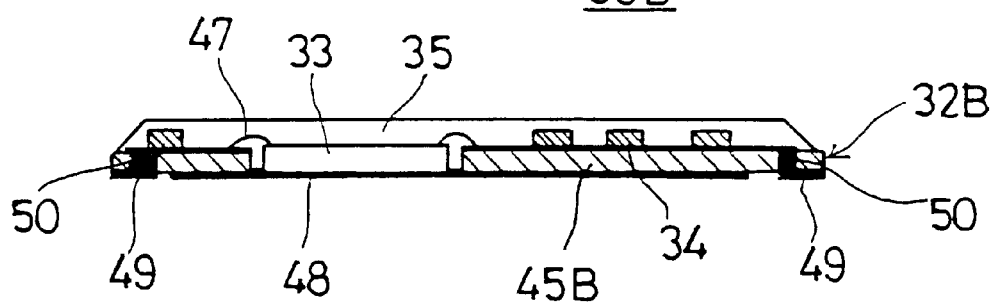
FIG. 11 is a schematic cross-sectional view of the high-frequency module shown in FIG. 10.

FIGS. 10 and 11 are a schematic plan view and a schematic cross-sectional view of a high-frequency module 30B according to the second embodiment of the present invention, respectively. In the following embodiments, the same or corresponding elements as or to those of the structures shown in FIGS. 4 and 5 are referred to by the same numerals and a description thereof is omitted.

According to the high-frequency module 30A of the first embodiment described by referring to FIGS. 4 and 5, the terminals 40A, 41A, 53A and 54A serving as the terminals for external connection are formed to extend outward from the peripheral portion of the upper surface of the base material 45A.

On the other hand, according to the high-frequency module 30B of the present embodiment, terminals 40B, 41B, 53B and 54B are not formed to extend outward from a base material 45B. Instead, the terminals 40B, 41B, 53B and 54B are electrically connected to respective land portions 49, or second wiring layers, serving as terminals for external connection by via holes 50 formed to penetrate the base material 45B. The land portions 49 are so formed on the lower surface of the base material 45B as to be electrically separated from the ground film 48, and are electrically connected to a mounting board (not shown) when the high-frequency module 30B is mounted thereon.

FIG. 12A is a cross-sectional view of one of the via holes 50 formed in the base material 45B according to the present embodiment. Each of the via holes 50 has the same structure in the present embodiment. FIG. 12A shows a state wherein only an aperture 57A forming the via holes 50 is formed in the substrate 45B before the aperture 57A is filled with a metal material. The aperture 57A forming the via hole 50 can be formed by chemical treatment such as etching because the base material 45B is made of polyimide. An overetched portion is inevitably developed in the aperture 57A during the etching process, so that the aperture 57A is formed to have a truncated cone shape or cross-sectionally a trapezoid shape as shown in FIG. 12A.

According to the present embodiment, the etching is performed from the side of a lower surface $45B_{-2}$ of the base material 45B. By thus performing the etching, the aperture 57A, or the via hole 50, is formed to have an upper opening on an upper surface $45B_{-1}$ of the base material 45B, of which the diameter size, as indicated by an double-headed arrow $L_1$ in FIG. 12A, is smaller than that, s indicated by an double-headed arrow $L_2$ in FIG. 12A, of a lower opening formed on the lower surface $45B_{-2}$ ($L_1 < L_2$).

On the other hand, if the etching is performed from the side of the upper surface $45B_{-1}$, an aperture 57B, as shown in FIG. 12B, is formed to have an upper opening on the upper surface $45B_{-1}$, of which the diameter size, as indicated by an double-headed arrow $L_3$ in FIG. 12B, is larger than that, as indicated by an double-headed arrow $L_4$ in FIG. 12B, of a lower opening formed on the lower surface $45B_{-2}$ ($L_3 > L_4$).

According to the structure of FIG. 12B, a large opening is formed on the upper surface $45B_{-1}$, which prevents the high-frequency active chip 33, the electronic components 34, etc. from being mounted thereon. Therefore, the size of the high-frequency substrate 32B inevitably becomes larger.

However, by performing the etching from the side of the lower surface $45B_{-2}$ of the base material 45B as in the present embodiment, a small opening is formed on the upper surface $45B_{-1}$, on which the high-frequency active chip 33, the electronic components 34, etc. are to be mounted. Therefore, an area occupied by the via hole 50 becomes so small on the upper surface $45B_{-1}$ as to permit latitude in the arrangement of the high-frequency active chip 33, the electronic components 34, etc.

This permits the high-frequency active chip 33, the electronic components 34, etc. to be disposed more compactly, thus allowing the downsizing of the high-frequency substrate 32B, or the high-frequency module 30B.

Figure 3:
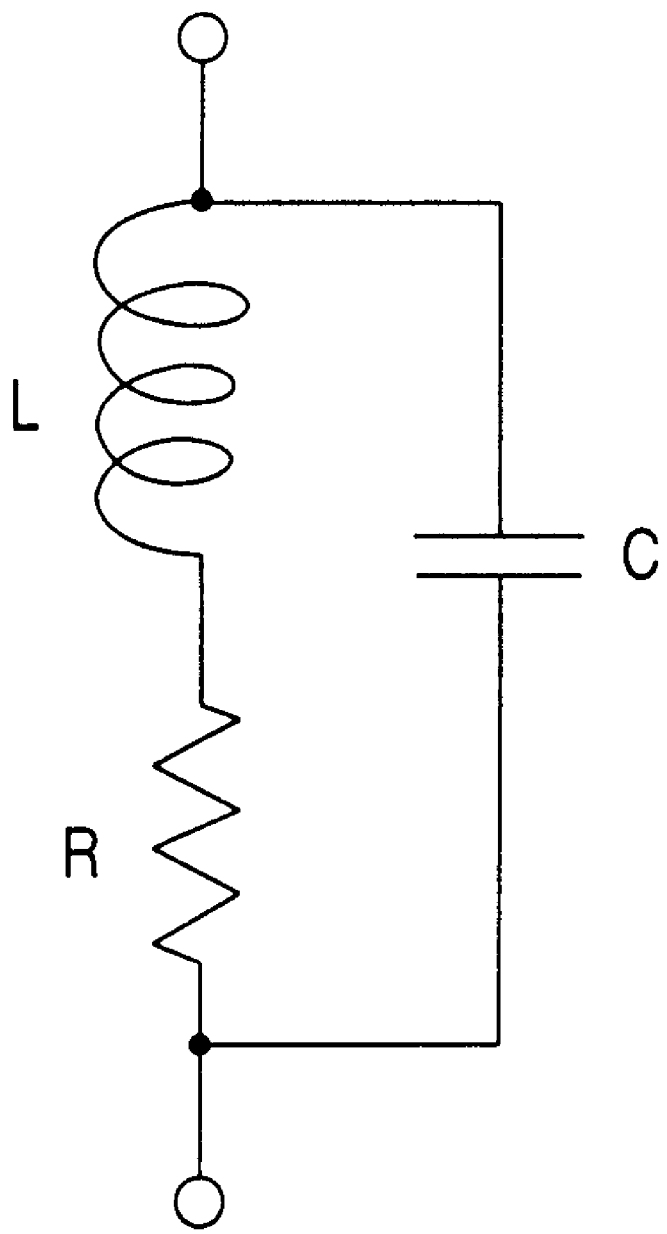
FIG. 3 is a diagram showing an electrically equivalent circuit to a via hole formed in the conventional high-frequency module shown in FIG. 1.

As previously described, according to the present invention, the via holes 50 are employed to connect the terminals 40B, 41B, 53B and 54B to the respective land portions 49 serving as the terminals for external connection. Therefore, also in the structure of the present embodiment, an equivalent circuit including an inductance L, an electrostatic capacity C and a resistance R as shown in FIG. 3 is formed in a position where each of the via holes 50 is formed.

In order to reduce the impedance of each of the via holes 50 to allow the high-frequency module 30B to have an improved high-frequency characteristic, it is required to reduce the inductance L and resistance R of the equivalent circuit. Specifically, it is required to enlarge the size of the diameter or the horizontal cross-sectional area of each of the via holes 50 and to reduce the thickness of the base material 45B, as described above.

According to the present embodiment, since the thin film resin sheet made of polyimide is employed as the base material 45B, the thickness of the base material 45B can be easily reduced. Further, by chemical treatment such as etching, each of the via holes 50 can freely be formed in the base material 45B to have a diameter in desired size. In other words, the diameter of each of the via holes 50 becomes larger with a longer period of etching time, and smaller with a shorter period of etching time.

Thus, by employing polyimide as the base material 45B, the impedance of each of the via holes 50 can be reduced and the high-frequency module 30B is allowed to have an improved high-frequency characteristic compared with a high-frequency module having a conventional structure. It is possible to provide the high frequency circuit of the high-frequency module 30B with a simple filtering characteristic by adjusting the thickness of the base material 45B and the shape of each of the via holes 50 so as to change the values of L, R and C of the equivalent circuit.

A description will now be given of a third embodiment of the present invention.

FIGS. 13 and 14 are a schematic plan view and a schematic cross-sectional view of a high-frequency module 30C according to the third embodiment of the present invention, respectively. The high-frequency module 30C has a similar structure to that of the high-frequency module 30B according to the second embodiment previously described by referring to FIGS. 10 and 11. However, a conductive material 55 is applied on the upper surface of the sealing resin 35 of the high-frequency module 30C.

The conductive material 55 is formed of a basic coating material made of resin which includes a conductive metal such as copper or gold. An equivalent state to a state wherein a metal film is formed on the upper surface of the sealing resin 35 is formed by drying the conductive material 55 applied on the upper surface of the sealing resin 35. That is to say, the conductive material 55 applied thereon serves as a shielding material to shield the upper surface of the high-frequency substrate 32B.

This prevents fluctuation in and the deterioration of the high-frequency characteristic of the high-frequency module 30C from being caused by closely disposing the high-frequency module 30C to the case or housing of a portable mobile terminal when the high-frequency module 30C is mounted inside the case.

Further, the shielding effect of the conductive material 55 can be enhanced by grounding the conductive material 55. For example, by connecting the conductive material 55, on the sides of the high-frequency substrate 32B, to a ground provided therein, the ground is shared and the shielding effect is thus enhanced. The shielding effect is also enhanced by putting the conductive material 55 in contact with a ground provided in a portable mobile terminal when the high-frequency module 30C is mounted in the case of the portable mobile terminal.

A description will now be given of a fourth embodiment of the present invention.

Figure 15:
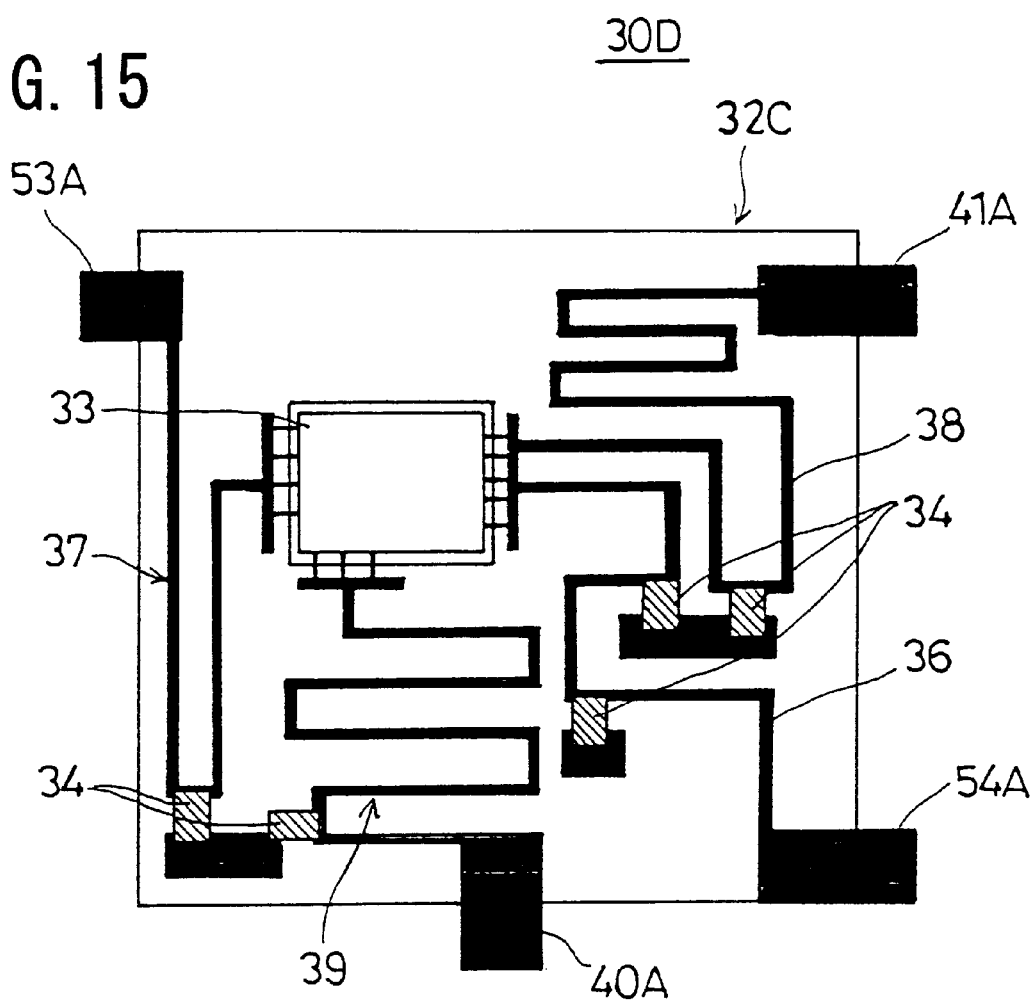
FIG. 15 is a schematic plan view of a high-frequency module according to a fourth embodiment of the present invention.
Figure 16:
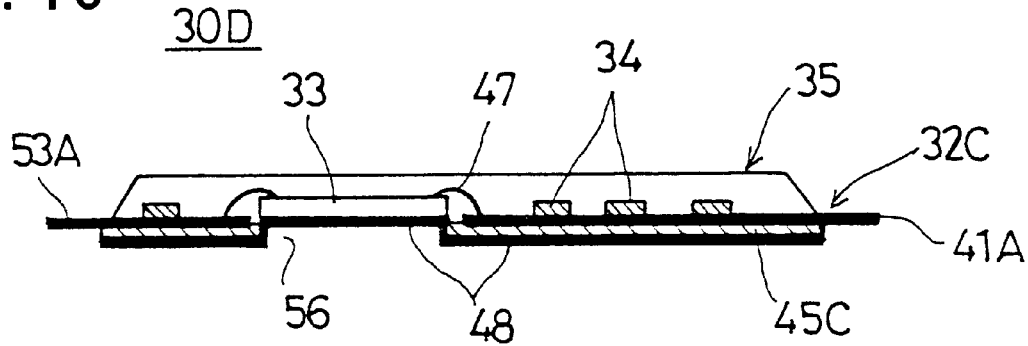
FIG. 16 is a schematic cross-sectional view of the high-frequency module shown in FIG. 15.

FIGS. 15 and 16 are a schematic plan view and a schematic cross-sectional view of a high-frequency module 30D according to the fourth embodiment of the present invention, respectively.

The high-frequency module 30D has a similar structure to that of the high-frequency module 30A according to the first embodiment previously described by referring to FIGS. 4 and 5.

According to the present embodiment, however, an opening portion 56 is formed in a position where the high-frequency active chip 33 is to be mounted to have an upper opening smaller in area on the upper surface of the base material 45C by being etched from the lower side of the base material 45C as in the way illustrated by referring to FIG. 12A. Further, the high-frequency active chip 33 is mounted on top of the ground film 48 provided to cover the upper surface of the opening portion 56 formed in the base material 45C.

According to the present embodiment, the opening portion 56 as well as the via holes 50 can be formed to have the upper opening smaller in area on the upper surface of the base material 45C by being etched from the lower side of the base material 45C. This permits latitude in the arrangement of the electronic components 34, the wiring lines 36 through 39, etc., thus allowing further miniaturization of the high-frequency substrate 32C, or the high-frequency module 30D.

A description will now be given of a fifth embodiment of the present invention.

Figure 17:
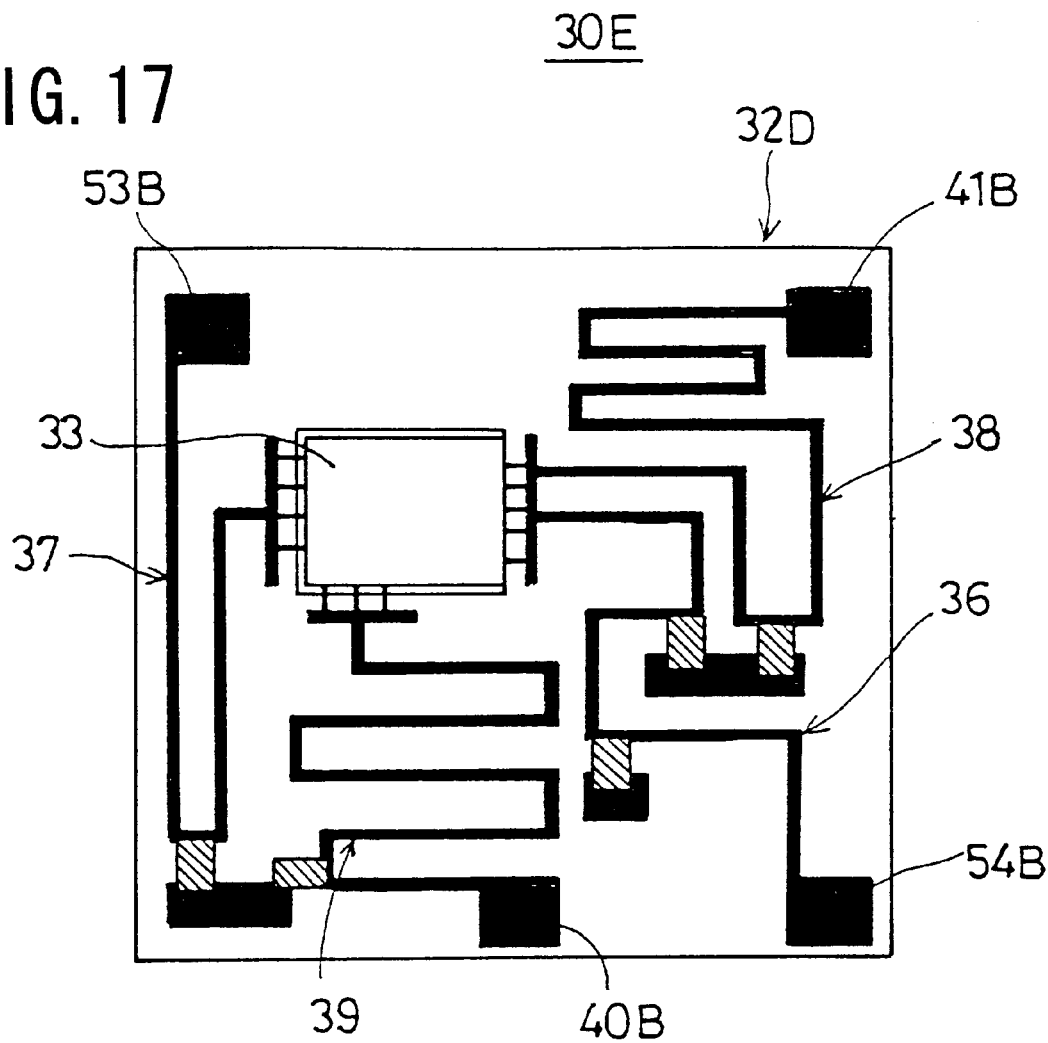
FIG. 17 is a schematic plan view of a high-frequency module according to a fifth embodiment of the present invention.
Figure 18:
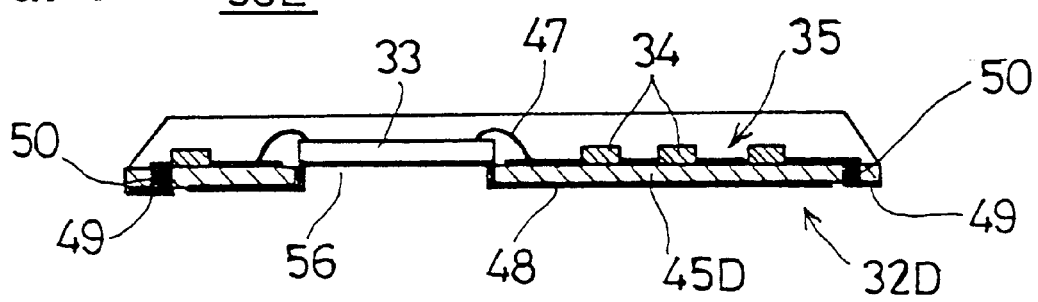
FIG. 18 is a schematic cross-sectional view of the high-frequency module shown in FIG. 17.

FIGS. 17 and 18 are a schematic plan view and a schematic cross-sectional view of a high-frequency module 30E according to the fifth embodiment of the present invention, respectively.

The high-frequency module 30E has a similar structure to that of the high-frequency module 30D according to the fourth embodiment previously described by referring to FIGS. 15 and 16. However, according to the high-frequency module 30D of the fourth embodiment, the terminals 40A, 41A, 53A and 54A serving as the terminals for external connection are formed to extend outward from the peripheral portion of the upper surface of the base material 45C.

On the other hand, according to the high-frequency module 30E of the present embodiment, the terminals 40B, 41B, 53B and 54B are not formed to extend outward from the base material 45D, but are formed to be electrically connected to the respective land portions 49 serving as the terminals for external connection by the via holes 50 formed to penetrate the base material 45D.

Thus, by connecting the terminals 40B, 41B, 53B and 54B to the respective land portions 49 by the via holes 50 formed in the base material 45D made of polyimide, the impedance of each of the via holes can be reduced as in the second embodiment previously described by referring to FIGS. 10 and 11. Therefore, the high-frequency module 30E is allowed to have an improved high-frequency characteristic compared with a high-frequency module having a conventional structure.

A description will now be given of a sixth embodiment of the present invention.

Figure 19:
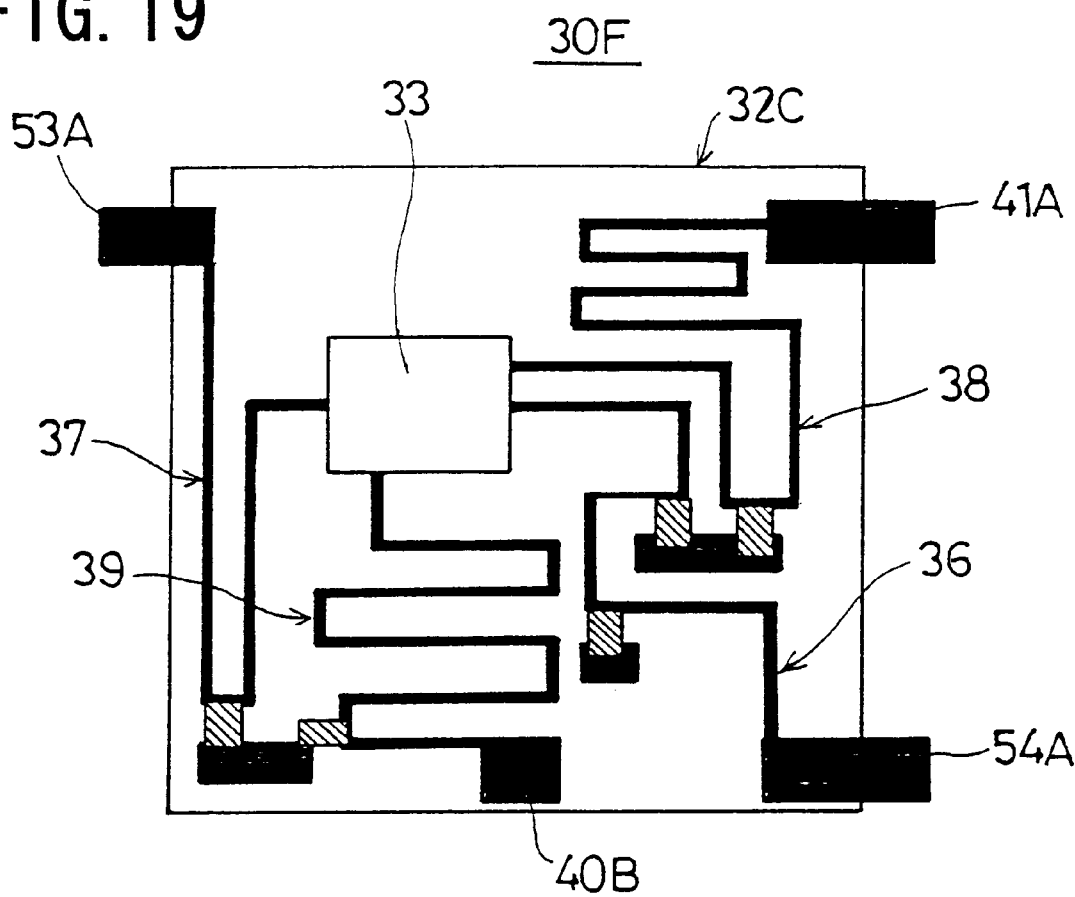
FIG. 19 is a schematic plan view of a high-frequency module according to a sixth embodiment of the present invention.
Figure 20:
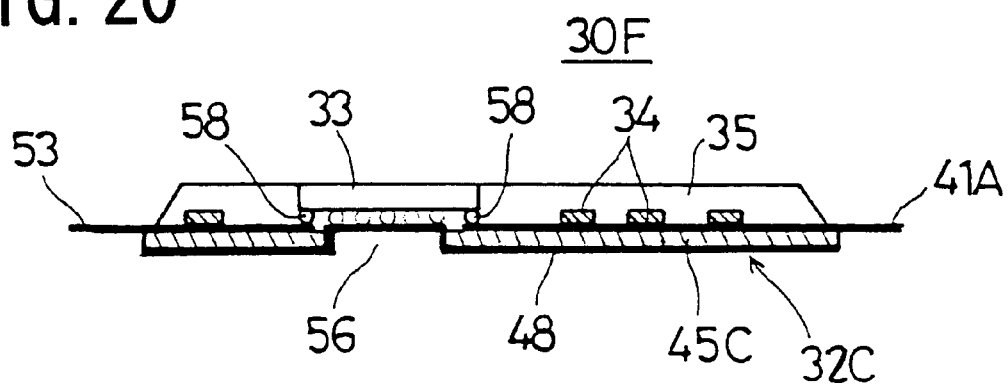
FIG. 20 is a schematic cross-sectional view of the high-frequency module shown in FIG. 19.

FIGS. 19 and 20 are a schematic plan view and a schematic cross-sectional view of a high-frequency module 30F according to the sixth embodiment of the present invention, respectively.

The high-frequency module 30F has a similar structure to that of the high-frequency module 30D previously described by referring to FIGS. 15 and 16. According to the high-frequency module 30D of the fourth embodiment, however, the high-frequency active chip 33 is electrically bonded to the high-frequency substrate 32C by the bonding wires 47.

On the other hand, according to the high-frequency module 30F of the present embodiment, the high-frequency active chip 33 is electrically bonded to the high-frequency substrate 32C by flip chip bonding via bumps 58 formed on the high-frequency active chip 33.

By thus bonding the high-frequency active chip 33 to the high-frequency substrate 32C by flip chip bonding, the sealing resin 35 can be made thinner by the loop height of each of the bonding wires 47 compared with the sealing resin 35 of the fourth embodiment, wherein the high-frequency active chip 33 is wire-bonded to the high-frequency substrate 32C. Thereby, the reduction of the height of the high-frequency module 30F can be realized.

When the high-frequency active chip 33 is bonded to the high-frequency substrate 32C by flip chip bonding, the heat radiation characteristic of the high-frequency active chip 33 can be enhanced by arranging the bumps 58 for flip chip bonding closely to the opening portion 56.

A description will now be given of a seventh embodiment of the present invention.

Figure 21:
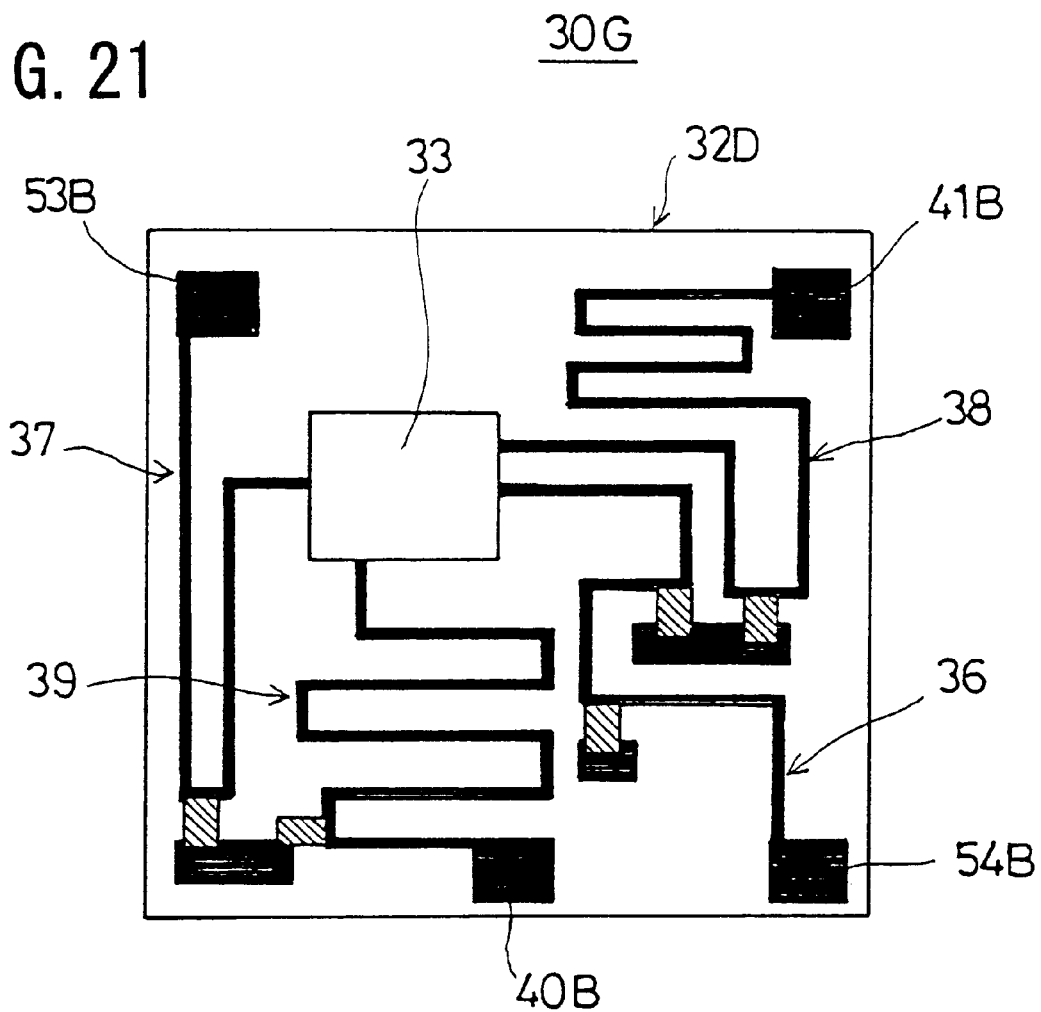
FIG. 21 is a schematic plan view of a high-frequency module according to a seventh embodiment of the present invention.
Figure 22:
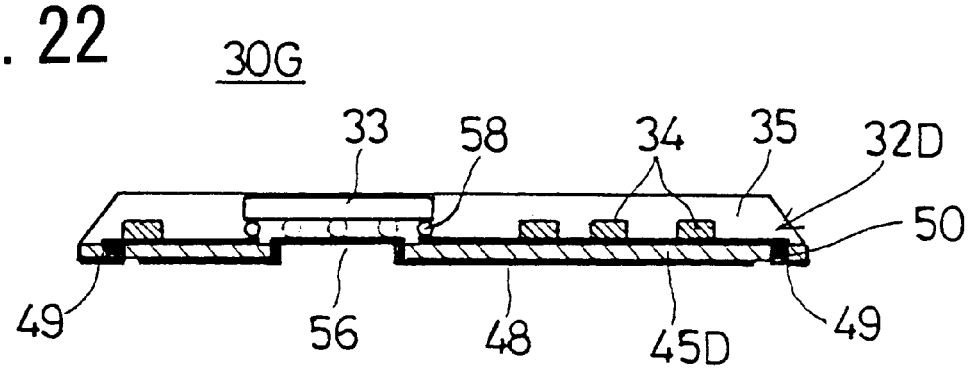
FIG. 22 is a schematic cross-sectional view of the high-frequency module shown in FIG. 21.

FIGS. 21 and 22 are a schematic plan view and a schematic cross-sectional view of a high-frequency module 30G according to the seventh embodiment of the present invention, respectively.

The high-frequency module 30G has a similar structure to that of the high-frequency module 30F according to the sixth embodiment previously described by referring to FIGS. 19 and 20. However, according to the high-frequency module 30F of the sixth embodiment, the terminals 40A, 41A, 53A and 54A serving as the terminals for external connection are formed to extend outward from the peripheral portion of the upper surface of the base material 45C.

On the other hand, according to the high-frequency module 30G of the present embodiment, the terminals 40B, 41B, 53B and 54B are not formed to extend outward from the base material 45D, but are formed to be electrically connected to the respective land portions 49 serving as the terminals for external connection by the via holes 50 formed to penetrate the base material 45D.

By thus connecting the terminals 40B, 41B, 53B and 54B to the respective land portions 49 by the via holes 50 formed in the base material 45D made of polyimide, the impedance of each of the via holes 50 can be reduced as in the second embodiment previously described by referring to FIGS. 10 and 11. Therefore, the high-frequency module 30G is allowed to have an improved high-frequency characteristic compared with a high-frequency module having a conventional structure.

A description will now be given of a eighth embodiment of the present invention.

Figure 23:
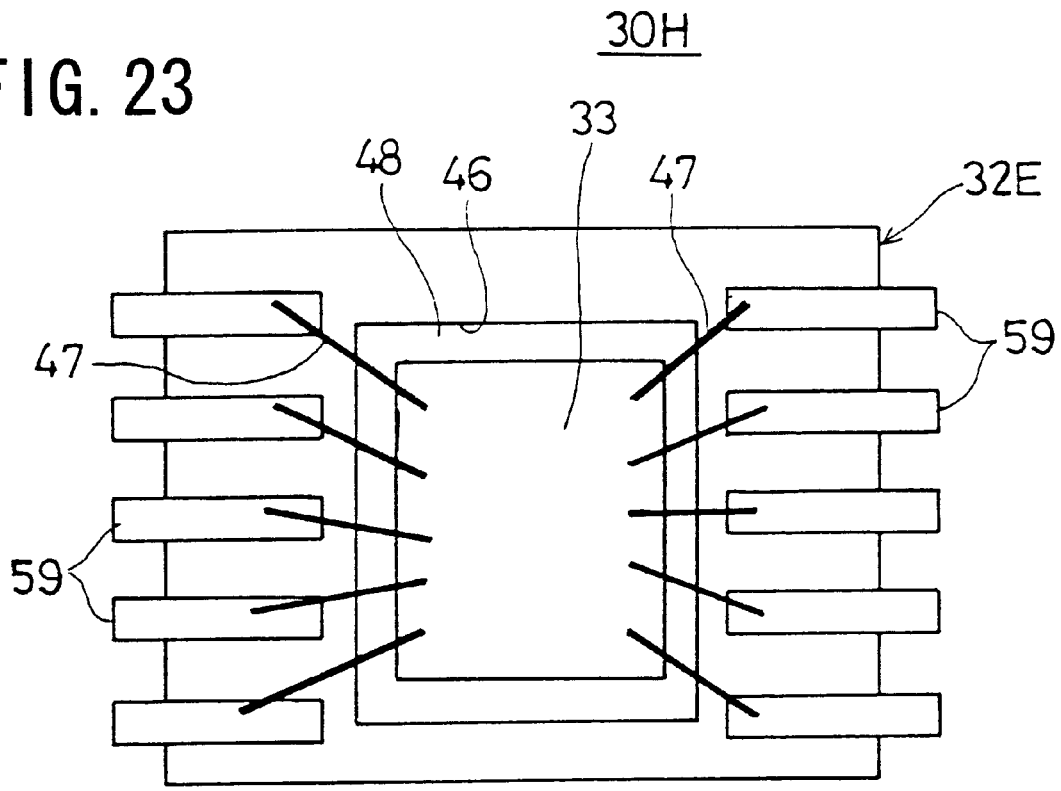
FIG. 23 is a schematic plan view of a high-frequency module according to a eighth embodiment of the present invention.
Figure 24:
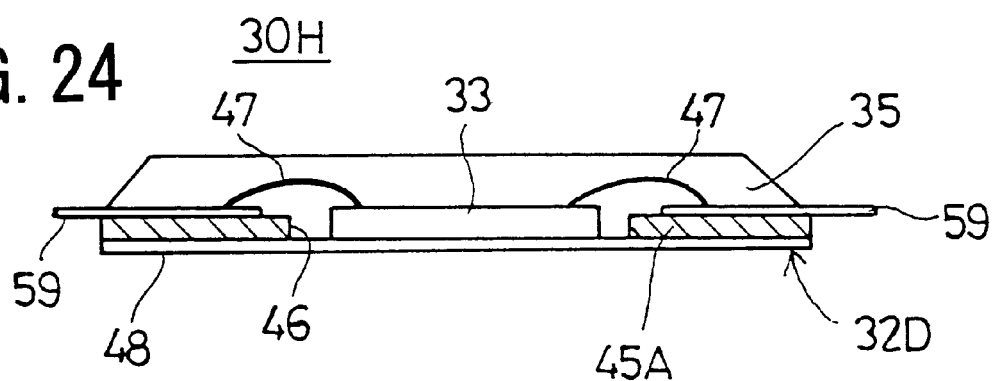
FIG. 24 is a schematic cross-sectional view of the high-frequency module shown in FIG. 23.

FIGS. 23 and 24 are a schematic plan view and a schematic cross-sectional view of a high-frequency module 30H according to the eighth embodiment of the present invention, respectively.

According to the high-frequency modules 30A through 30G of the respective first through seventh embodiments previously described, the electronic components 34 as well as the high-frequency active ship 33 are mounted and the wiring lines 36 through 39 are formed on each of the high-frequency substrates 32A through 32D.

On the other hand, according to the high-frequency module 30H of the present embodiment, there are only the high-frequency active chip 33 and leads 59 serving as terminals for external connection provided on the base material 45A made of polyimide, which forms a high-frequency substrate 32E. The leads 59, which are electrically bonded to the high-frequency active chip 33 by the bonding wires 47, extend outward from the peripheral portion of the upper surface of the base material 45A.

The high-frequency module 30H can be formed to comply with a surface mounting by forming the extending portion of each of the leads 59, for example, into a gull-wing shape.

The opening portion 46 is formed in a position where the high-frequency active chip 33 is to be mounted, and the ground film 48 is formed on the lower surface of the base material 45A to close the lower portion of the opening portion 46.

The high-frequency active chip 33 is mounted inside the opening portion 46 and joined by a gold-tin alloy to the ground film 48 positioned at the bottom portion of the opening portion 46. Therefore, also in the present embodiment, heat generated in the high-frequency active chip 33 can be efficiently radiated to outer air through the ground film 48 as previously described in the first embodiment, thus allowing the heat radiation characteristic of the high-frequency active chip 33 to be enhanced.

The sealing resin 35 is formed on the upper surface of the high-frequency substrate 32E by potting or molding, serving as a protection for the high-frequency active chip 33 and the portions of the leads 59 provided on the upper surface of the high-frequency substrate 32E.

According to the high-frequency module 30H having the above structure, because the thin film resin sheet made of polyimide is employed as the base material 45A, the same effect as is previously described in the first embodiment can be obtained. Further, since the electronic components 34 and the wiring lines 36 through 39 are not provided on the high-frequency substrate 32E, the high-frequency module 30H can be further miniaturized compared with the high-frequency modules of the previously described embodiments.

A description will now be given of a ninth embodiment of the present invention.

Figure 25:
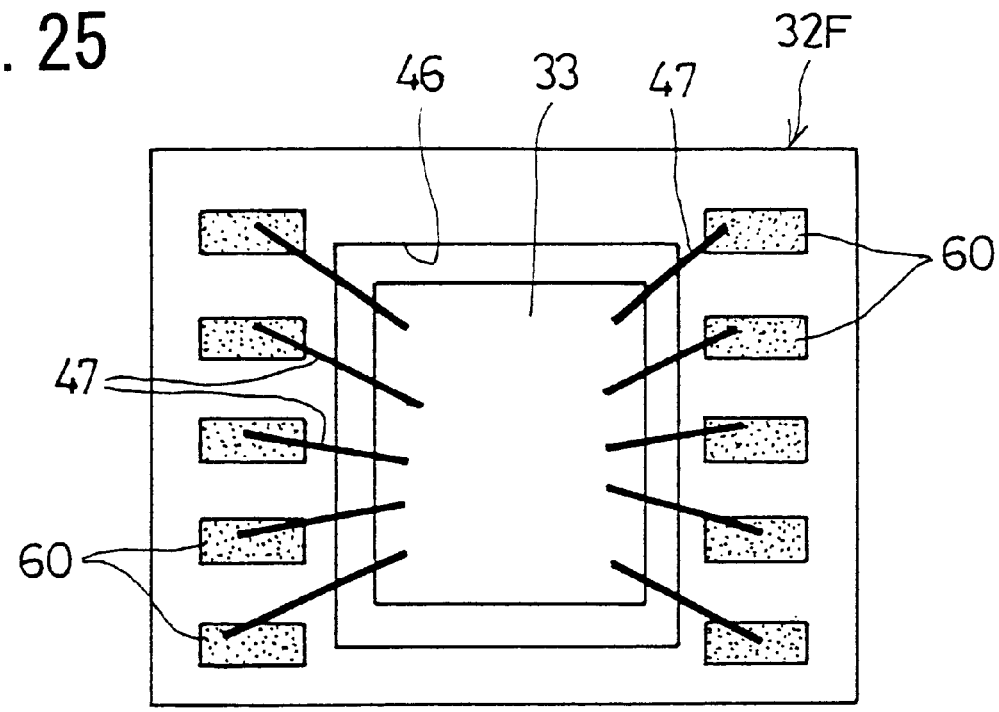
FIG. 25 is a schematic plan view of a high-frequency module according to a ninth embodiment of the present invention.
Figure 26:
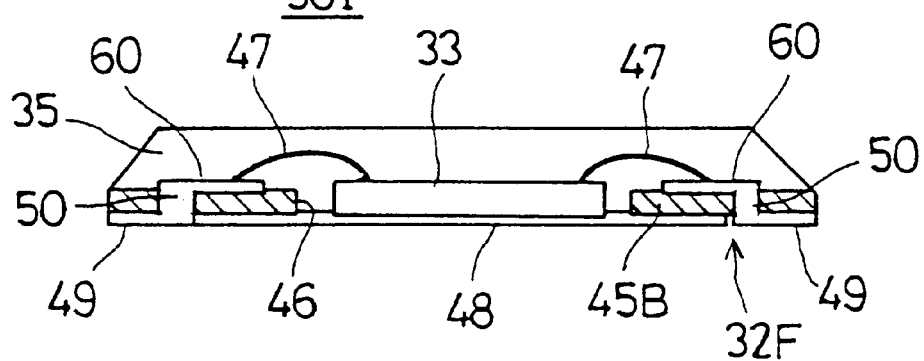
FIG. 26 is a schematic cross-sectional view of the high-frequency module shown in FIG. 25.

FIGS. 25 and 26 are a schematic plan view and a schematic cross-sectional view of a high-frequency module 30I according to the ninth embodiment of the present invention, respectively.

The high-frequency module 30I has a similar structure to that of the high-frequency module 30H according to the eighth embodiment previously described by referring to FIGS. 23 and 24. However, according to the high-frequency module 30H of the eighth embodiment, the leads 59 serving as the terminals for external connection are formed to extend outward from the peripheral portion of the upper surface of base material 45A.

On the other hand, according to the high-frequency module 30I of the present embodiment, the leads 59 are replaced with bonding pads 60.

The bonding pads 60 are not formed to extend outward from the base material 45B, but to be electrically connected to the respective land portions 49 serving as terminals for external connection by the via holes 50 formed to penetrate the base material 45B. The land portions 49 are so formed on the lower surface of the base material 45B as to be electrically separated from the ground film 48, and are electrically connected to a mounting board (not shown) when the high-frequency module 30I is mounted thereon.

Each of the via holes 50 according to the present embodiment has the same structure as shown in FIG. 12A. Thus, the downsizing of a high-frequency substrate 32F, or the high-frequency module 30I can be realized.

Since the via holes 50 are employed also in the present embodiment, an equivalent circuit including L, C and R as shown in FIG. 3 is formed in a position where each of the via holes 50 is formed. However, because the thin film resin sheet made of polyimide is employed as the base material 45B also in the present embodiment, the thickness of the base material 45B can be easily reduced and each of the via holes 50 can freely be formed to have a diameter in desired size. Therefore, the impedance of each of the via holes 50 can be reduced and the high-frequency module 30I is allowed to have an improved high-frequency characteristic compared with a high-frequency module having a conventional structure.

A description will now be given of a tenth embodiment of the present invention.

Figure 27:
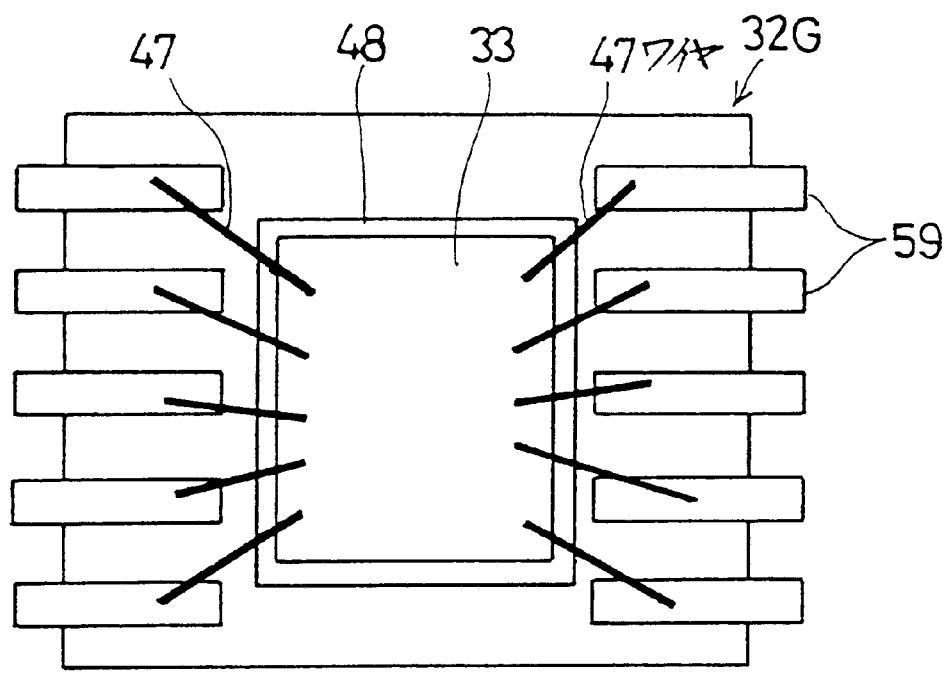
FIG. 27 is a schematic plan view of a high-frequency module according to a tenth embodiment of the present invention.
Figure 28:
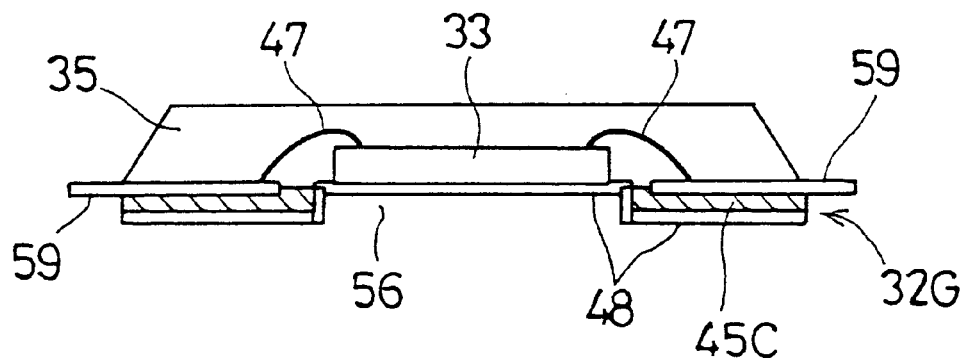
FIG. 28 is a schematic cross-sectional view of the high-frequency module shown in FIG. 27.

FIGS. 27 and 28 are a schematic plan view and a schematic cross-sectional view of a high-frequency module 30J according to the tenth embodiment of the present invention, respectively.

The high-frequency module 30J has a similar structure to that of the high-frequency module 30H according to the eighth embodiment previously described by referring to FIGS. 23 and 24.

However, according to the high-frequency module 30J of the present embodiment, the opening portion 56 is formed, in a position where the high-frequency active chip 33 is to be mounted, to have an upper opening smaller in area on the upper surface of the base material 45C by being etched from the lower side of the base material 45C as in the way illustrated by referring to FIG. 12A. Further, the high-frequency active chip 33 is mounted on top of the ground film 48 provided to cover the upper surface of the opening portion 56 formed in the base material 45C.

According to the present embodiment, the opening portion 56 can be formed to have the upper opening smaller in area on the upper surface of the base material 45C as in the fourth embodiment previously described by referring to FIGS. 15 and 16, thus allowing further miniaturization of a high-frequency substrate 32G, or the high-frequency module 30J.

A description will now be given of a 11th embodiment of the present invention.

Figure 29:
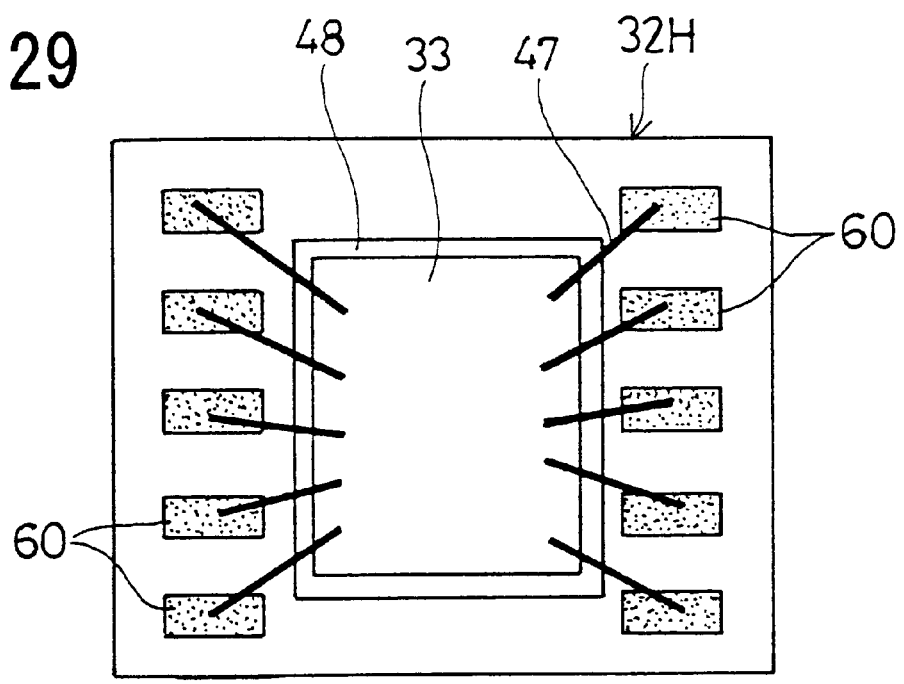
FIG. 29 is a schematic plan view of a high-frequency module according to a 11th embodiment of the present invention.
Figure 30:
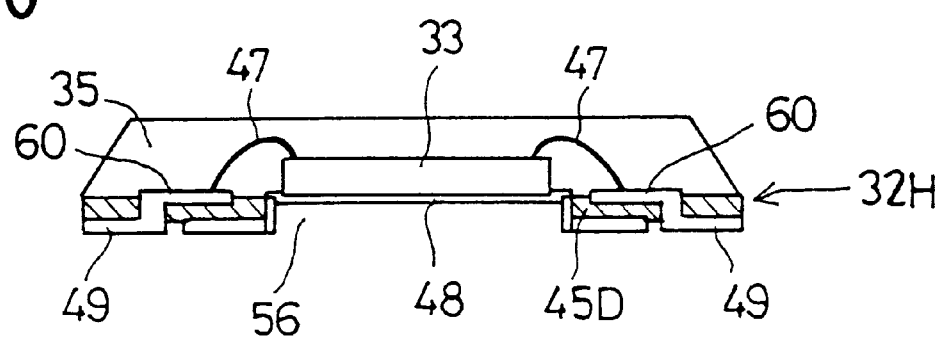
FIG. 30 is a schematic cross-sectional view of the high-frequency module shown in FIG. 29.

FIGS. 29 and 30 are a schematic plan view and a schematic cross-sectional view of a high-frequency module 30K according to the 11th embodiment of the present invention, respectively.

The high-frequency module 30K has a similar structure to that of the high-frequency module 30J according to the tenth embodiment previously described by referring to FIGS. 27 and 28. However, according to the high-frequency module 30J of the tenth embodiment, the leads 59 serving as the terminals for external connection are formed to extend outward from the peripheral portion of the upper surface of the base material 45C.

On the other hand, according to the high-frequency module 30K of the present invention, the leads 59 are replaced with the bonding pads 60. The bonding pads 60 are not formed to extend outward from the base material 45D, but to be electrically connected to the respective land portions 49 serving as the terminals for external connection by the via holes 50 formed to penetrate the base material 45D.

Therefore, according to the present embodiment, for the same reason as presented in the case of the high-frequency module 30I of the ninth embodiment previously described by referring to FIGS. 25 and 26, the downsizing of a high-frequency substrate 32H, or the high-frequency module 30K, can be realized, and the high-frequency module 30K is allowed to have an improved high-frequency characteristic compared with a high-frequency module having a conventional structure.

A description will now be given of a 12th embodiment of the present invention.

Figure 31:
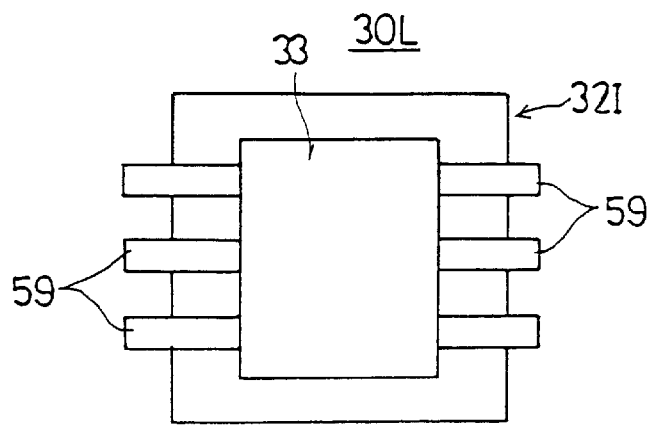
FIG. 31 is a schematic plan view of a high-frequency module according to a 12th embodiment of the present invention.
Figure 32:
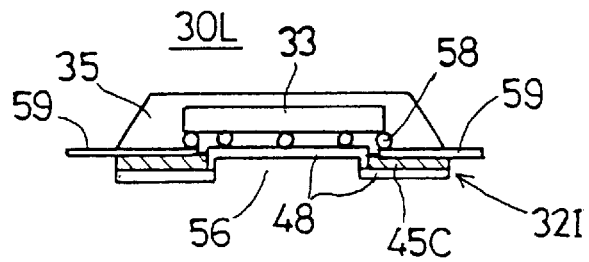
FIG. 32 is a schematic cross-sectional view of the high-frequency module shown in FIG. 31.

FIGS. 31 and 32 are a schematic plan view and a schematic cross-sectional view of a high-frequency module 30L according to the 12th embodiment of the present invention, respectively.

The high-frequency module 30L has a similar structure to that of the high-frequency module 30J according to the tenth embodiment previously described by referring to FIGS. 27 and 28. However, according to the high-frequency module 30J of the tenth embodiment, the high-frequency active chip 33 is electrically bonded to the high-frequency substrate 32G by the bonding wires 47.

On the other hand, according to the high-frequency module 30L of the present invention, the high-frequency active chip 33 is electrically bonded to the high-frequency substrate 32I by flip chip bonding via bumps 58 formed on the high-frequency active chip 33.

By thus bonding the high-frequency active chip 33 to the high-frequency substrate 32I by flip chip bonding, the sealing resin 35 can be made thinner by the loop height of each of the bonding wires 47 compared with the sealing resin 35 of the tenth embodiment, wherein the high-frequency active chip 33 is wire-bonded to the high-frequency substrate 32G. Thereby, the reduction of the height of the high-frequency module 30L can be realized.

A description will now be given of a 13th embodiment of the present embodiment.

Figure 33:
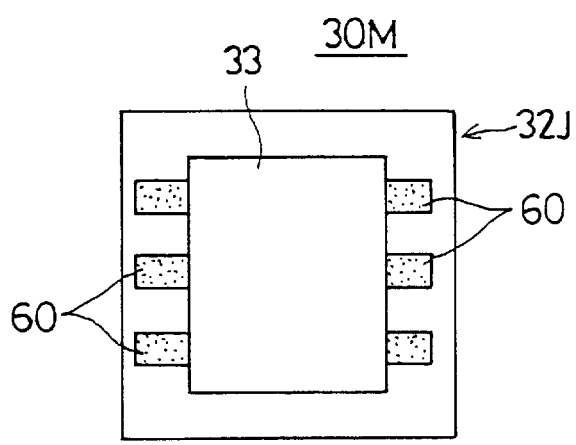
FIG. 33 is a schematic plan view of a high-frequency module according to a 13th embodiment of the present invention.
Figure 34:
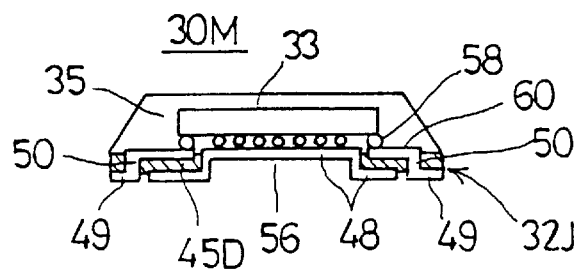
FIG. 34 is a schematic cross-sectional view of the high-frequency module shown in FIG. 33.

FIGS. 33 and 34 are a schematic plan view and a schematic cross-sectional view of a high-frequency module 30M according to the 13th embodiment of the present invention, respectively.

The high-frequency module 30M has a similar structure to that of the high-frequency module 30L according to the 12th embodiment previously described by referring to FIGS. 31 and 32. However, according to the high-frequency module 30L of the 12th embodiment, the leads 59 serving as the terminals for external connection are formed to extend outward from the peripheral portion of the upper surface of the base material 45C.

On the other hand, according to the high-frequency module 30M of the present embodiment, the leads 59 are replaced with the bonding pads 60. The bonding pads 60 are not formed to extend outward from the base material 45D, but to be electrically connected to the respective land portions 49 by the via holes 50 formed to penetrate the base material 45D.

Therefore, according to the present embodiment, for the same reason as presented in the case of the high-frequency module 30I of the ninth embodiment previously described by referring to FIGS. 25 and 26, the downsizing of a high-frequency substrate 32J, or the high-frequency module 30M, can be realized, and the high-frequency module 30M is allowed to have an improved high-frequency characteristic compared with a high-frequency module having a conventional structure.

Figure 35:
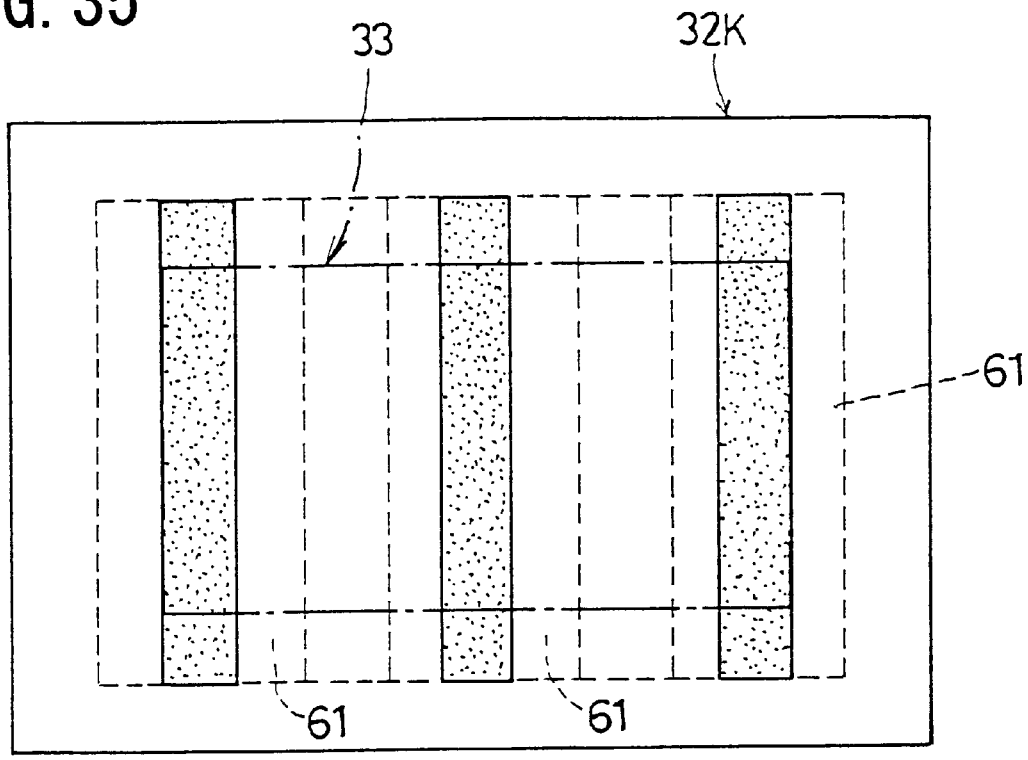
FIG. 35 is a schematic plan view of a variation of the high-frequency module shown in FIG. 33.
Figure 36:
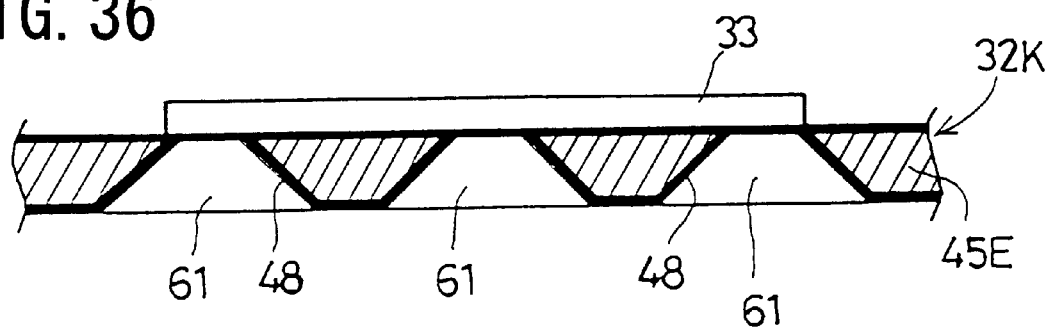
FIG. 36 is a schematic cross-sectional view of the high-frequency module shown in FIG. 35.

FIGS. 35 and 36 each are a schematic plan view and a schematic cross-sectional view of a high-frequency substrate 32K, which is a variation of the high-frequency substrate 32J shown in FIGS. 33 and 34. According to the high-frequency substrate 32J, the opening portion 56 is formed almost all over a position where the high-frequency active chip 33 is to be mounted. An advantage of this structure lies in that heat generated from the high-frequency active chip 33 can be efficiently radiated, while this structure has the disadvantage of a reduced mechanical strength to support the high-frequency active chip 33 because the high-frequency active chip 33 is supported only by the ground film 48.

Therefore, according to the present variation, a base material 45E forming the high-frequency substrate 32K has a plurality of groove-like opening portions 61 formed in a position where the high-frequency active chip 33 is to be mounted. Further, the ground film 48 is formed on the surfaces of the groove-like opening portions 61. According to this structure, the ground film 48 is shaped like a bellows.

By thus forming the groove-like opening portions 61, when the high-frequency active chip 33, which is indicated by dot-dash lines in FIG. 35, is mounted on the high-frequency substrate 32K, the mechanical strength to support the high-frequency active chip 33 can be enhanced in positions where the high-frequency active chip 33 faces the base material 45E, and the heat radiation characteristic of the high-frequency active chip 33 can be enhanced in positions where the high-frequency active chip 33 comes in direct contact with the ground film 48.

Therefore, according to the present embodiment, the mechanical strength to support the high-frequency active chip 33 can be enhanced with the good heat radiation characteristic of the high-frequency active chip 33 being maintained.

A description will now be given of a 14th embodiment of the present invention.

Figure 37:
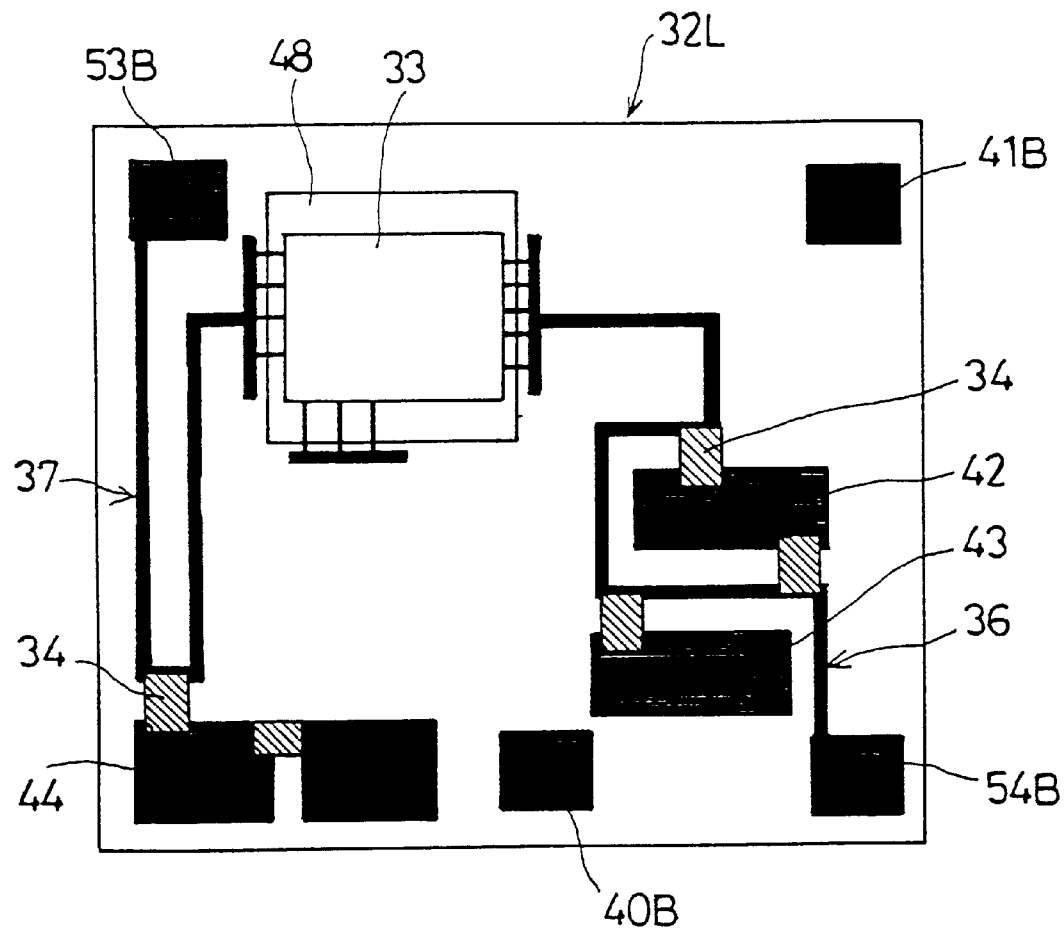
FIG. 37 is a schematic plan view of a high-frequency module according to a 14th embodiment of the present invention.
Figure 38:
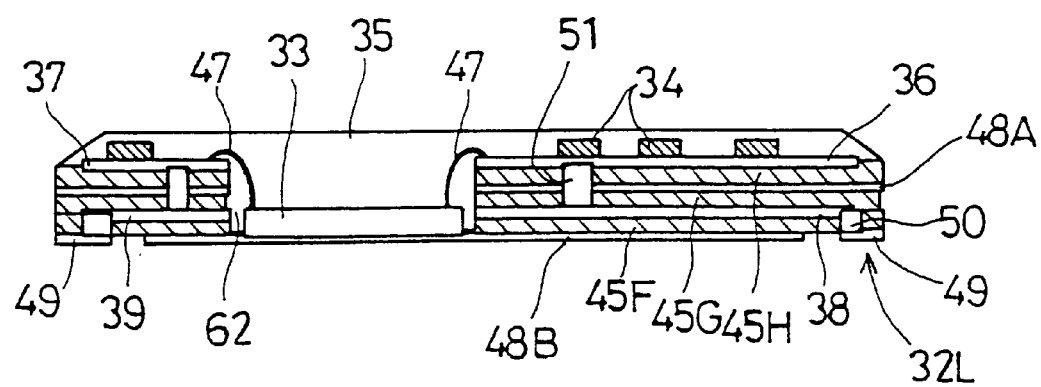
FIG. 38 is a schematic cross-sectional view of the high-frequency module shown in FIG. 37.

FIGS. 37 and 38 are a schematic plan view and a schematic cross-sectional view of a high-frequency module 30N according to the 14th embodiment of the present invention, respectively.

According to the high-frequency modules 30A through 30M of the above described embodiments, each of the base materials 45A through 45E of the respective high-frequency substrate 32A through 32K has a single-layer structure. On the other hand, according to the present embodiment, a plurality of (three, in FIG. 38) base materials 45F through 45H are layered to form a high-frequency substrate 32L. In other words, the high-frequency substrate 32L has a multi-layered substrate structure.

Each of the base materials 45A through 45E is the thin film resin sheet made of polyimide, and has a wiring layer on each of the upper and lower surfaces thereof. A ground film 48B and the land portions 49 are formed on the lower surface of the base material 45F forming the lowest portion of the high-frequency substrate 32L. The DC circuit wiring lines 38 and 39 are formed between the base material 45F and the base material 45G, which is laid over the base material 45F.

A ground film 48A is formed between the base material 45G and the base material 45H, which is laid over the base material 45G. The electronic components 34 and the high-frequency circuit wiring lines 36 and 37 are provided on the upper surface of the base material 45H. The wiring lines 36 and 37 are interconnected to the wiring lines 38 and 39 through via holes 51 formed to penetrate the base materials 45G and 45H, and further to the land portions 49 through the via holes 50 formed to penetrate the base material 45F.

An opening portion 62 is formed, in a position in the high-frequency substrate 32L where the high-frequency active chip 33 is to be mounted, to penetrate the base materials 45F through 45H. The ground film 48B closes the bottom portion of the opening portion 62. The high-frequency active chip 33 is joined by a gold-tin alloy to the ground film 48B positioned at the bottom portion of the opening portion 62.

Further, the high-frequency active chip 33 is electrically bonded to the high-frequency substrate 32L by the bonding wires 47. The sealing resin 35 is provided on the upper surface of the high-frequency substrate 32L having the above structure, serving as a protection for the high-frequency active chip 33, the electronic components 34, etc.

According to the present embodiment, the multilayered high-frequency substrate 32L permits more latitude in the arrangement of the wiring lines 36 through 39, thus allowing the further miniaturized high-frequency module 30N to be realized. Further, the high-frequency circuit wiring lines 36 and 37 can be formed to be separated from the DC circuit wiring lines 38 and 39 by the ground film 48A, thus allowing the high-frequency module 30N with an excellent electrical characteristic to be realized.

The present invention is not limited to the specifically disclosed embodiments, and variations and modifications may be made without departing from the scope of the present invention.

The present application is based on Japanese priority application No. 11-310159 filed on Oct. 29, 1999, the entire contents of which are hereby incorporated by reference.

What is claimed is:

1. A high-frequency module comprising:
a substrate including a thin film resin sheet;
a high-frequency circuit wiring line forming a first wiring layer, the high-frequency circuit wiring line formed on an upper surface of the substrate;
a high-frequency circuit component provided on the upper surface of the substrate in electrical connection with the high-frequency circuit wiring line;
a resin sealing package formed on the upper surface of the substrate, the resin sealing package sealing the first wiring layer and the high-frequency circuit component;
an opening portion formed in the substrate;
a ground film formed on the lower surface of the substrate, the ground film extending continuously along said lower surface so as to close an opening of the opening portion; and
a semiconductor chip directly mounted on the ground film inside the opening portion, said semiconductor chip being electrically connected to said high-frequency circuit wiring line.

2. The high-frequency module as claimed in claim 1, further comprising:
a second wiring layer formed on a lower surface of the substrate; and
a via hole formed in the substrate, the via hole electrically connecting the first and second wiring layers.

3. The high-frequency module as claimed in claim 2, wherein a size of a diameter of the via hole is smaller on the lower surface of the substrate than on the upper surface thereof.

4. The high-frequency module as claimed in claim 1, wherein polyimide is employed as the thin film resin sheet.

5. The high-frequency module as claimed in claim 1, wherein a thickness of the substrate is set to 25 to 75 $\mu$m.

6. The high-frequency module as claimed in claim 1, wherein a conductive material is applied on an upper surface of the resin sealing package.

7. The high-frequency module as claimed in claim 1, wherein the semiconductor chip is bonded to the substrate by flip chip bonding.

8. The high-frequency module as claimed in claim 1, wherein the substrate has a plurality of opening portions so that the ground film is shaped like a bellows in correspondence to the plurality of opening portions.

9. The high-frequency module as claimed in claim 1, wherein the substrate substantially has a relative dielectric constant of 3.1.

* * * * *